United States Patent
Lee et al.

(10) Patent No.: US 9,935,279 B2
(45) Date of Patent: Apr. 3, 2018

(54) FLEXIBLE DISPLAY DEVICE

(71) Applicant: SAMSUNG ELECTRONICS CO., LTD., Suwon-si (KR)

(72) Inventors: Eun-hwa Lee, Suwon-si (KR);
Kyung-wan Park, Suwon-si (KR);
Yu-su Kim, Suwon-si (KR);
Jin-hyoung Park, Suwon-si (KR);
Ho-seong Seo, Suwon-si (KR); Ga-eun Lee, Suwon-si (KR); Shi-yun Cho, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/952,072

(22) Filed: Nov. 25, 2015

(65) Prior Publication Data
US 2016/0155967 A1  Jun. 2, 2016

(30) Foreign Application Priority Data

Nov. 27, 2014 (KR) ......................... 10-2014-0167815
Jun. 19, 2015 (KR) ......................... 10-2015-0087284

(51) Int. Cl.
*H01L 51/00* (2006.01)
*G06F 3/041* (2006.01)
(Continued)

(52) U.S. Cl.
CPC ........ *H01L 51/0097* (2013.01); *G06F 1/1652* (2013.01); *G06F 3/044* (2013.01);
(Continued)

(58) Field of Classification Search
CPC combination set(s) only.
See application file for complete search history.

(56) References Cited

U.S. PATENT DOCUMENTS 7,816,856 B2  10/2010  Cok et al.
2006/0132025 A1*  6/2006  Gao ........................ H01L 51/52
                                                              313/503
(Continued)

FOREIGN PATENT DOCUMENTS

EP     2648079 A1    10/2013
JP    2003-114766 A   4/2003
(Continued)

OTHER PUBLICATIONS

Communication dated Apr. 22, 2016, issued by the International Searching Authority in counterpart International Application No. PCT/KR2015/012339 (PCT/ISA/210 & PCT/ISA/237).
(Continued)

*Primary Examiner* — Robin Mishler
(74) *Attorney, Agent, or Firm* — Sughrue Mion, PLLC

(57) ABSTRACT

A plurality of panels include: a display panel; and a protective panel that is disposed outside the display panel, and includes a transparent substrate and an outer hard coating layer and an inner hard coating layer that are respectively formed on an outer surface and an inner surface of the transparent substrate, and each have a hardness greater than a hardness of the transparent substrate. A thickness of the outer hard coating layer is greater than a thickness of the inner hard coating layer, and a stress neutral surface of the flexible display device is configured so that a compressive stress is applied to the inner hard coating layer when the flexible display device is bent.

26 Claims, 17 Drawing Sheets

(51) Int. Cl.
    *G06F 3/044*     (2006.01)
    *H01L 27/32*     (2006.01)
    *H01L 51/52*     (2006.01)
    *G06F 1/16*     (2006.01)
    *H04M 1/02*     (2006.01)

(52) U.S. Cl.
    CPC .......... *G06F 3/0412* (2013.01); *H01L 27/323* (2013.01); *H01L 51/5246* (2013.01); *H01L 51/5253* (2013.01); *H01L 51/5281* (2013.01); *G06F 2203/04102* (2013.01); *G06F 2203/04103* (2013.01); *H01L 27/3244* (2013.01); *H01L 2251/5338* (2013.01); *H01L 2251/558* (2013.01); *H04M 1/022* (2013.01); *H04M 1/0268* (2013.01); *Y02E 10/549* (2013.01)

(56) References Cited

U.S. PATENT DOCUMENTS

| | | | |
|---|---|---|---|
| 2010/0213819 A1 | 8/2010 | Cok et al. | |
| 2010/0308335 A1* | 12/2010 | Kim | H01L 27/3244 257/59 |
| 2011/0315956 A1* | 12/2011 | Tischler | H01L 23/4985 257/13 |
| 2012/0044181 A1 | 2/2012 | Kim et al. | |
| 2012/0229423 A1 | 9/2012 | Takamiya et al. | |
| 2013/0285938 A1 | 10/2013 | Kang et al. | |
| 2014/0036170 A1* | 2/2014 | Nashiki | G06F 3/044 349/12 |
| 2014/0049699 A1* | 2/2014 | Huang | G02B 5/3016 349/12 |
| 2014/0131668 A1 | 5/2014 | Kim | |
| 2014/0132150 A1 | 5/2014 | You | |

FOREIGN PATENT DOCUMENTS

| | | |
|---|---|---|
| JP | 3152062 U | 7/2009 |
| JP | 2012518892 A | 8/2012 |
| KR | 1020100092795 A | 8/2010 |
| KR | 10-2010-0129512 A | 12/2010 |
| KR | 1020110060328 A | 6/2011 |

OTHER PUBLICATIONS

Communication dated Nov. 8, 2017, from the European Patent Office in counterpart European Application No. 15863484.0.

Office Action dated Nov. 30, 2017, issued by the Australian Patent Office in counterpart Australian Application No. 2015355047.

* cited by examiner

FLEXIBLE DISPLAY DEVICE

CROSS-REFERENCE TO RELATED APPLICATIONS

This application claims priority from Korean Patent Application Nos. 10-2014-0167815 and 10-2015-0087284, filed on Nov. 27, 2014 and Jun. 19, 2015, respectively, in the Korean Intellectual Property Office, the disclosures of which are incorporated herein by reference in their entireties.

BACKGROUND

1. Field

Methods and apparatuses consistent with exemplary embodiments relate to flexible display devices that may be pliably bent.

2. Description of the Related Art

A portable foldable device (e.g., a mobile device) such as a communication terminal, a game console, a multimedia device, a portable computer, or a photographing apparatus may include a display device that displays image information and an input unit such as a keypad. Mobile devices may have a foldable structure that may be folded into a smaller size to improve portability. In foldable mobile devices, two bodies are connected to each other via the foldable structure. Because a conventional display may not fold, the conventional display device may be positioned on only one of the two bodies. Hence, it is difficult to apply a large display device to a mobile device having a foldable structure.

Flexible displays have been applied to a mobile device having a foldable structure. Because the flexible display may be placed over two bodies to cross over the foldable structure, a large screen may be provided.

In a flexible display device, a plurality of panel layers, including a display panel, may be stacked. Because a surface layer of the flexible display device is exposed to the outside, the surface layer may be scratched while the flexible display device is used.

SUMMARY

Exemplary embodiments may address at least the above problems and/or disadvantages and other disadvantages not described above. Also, exemplary embodiments are not required to overcome the disadvantages described above, and an exemplary embodiment may not overcome any of the problems described above.

One or more exemplary embodiments provide a flexible display device including a surface layer that may be resistant against scratches.

One or more exemplary embodiments provide a flexible display device that may have stable folding and unfolding characteristics and may reduce image distortion.

Additional aspects will be set forth in part in the description which follows and, in part, will be apparent from the description, or may be learned by practice of exemplary embodiments.

According to an aspect of an exemplary embodiment, there is provided a flexible display device including a plurality of panels that are adhered to each other by using at least one adhesive layer, the flexible display device including: a display panel configured to display an image; and a protective panel disposed outside the display panel and including a transparent substrate, an outer hard coating layer formed on an outer surface of the transparent substrate, and an inner hard coating layer formed on an inner surface of the transparent substrate, and each of the outer hard coating layer, and the inner hard coating layer has a hardness greater than a hardness of the transparent substrate, wherein a thickness of the outer hard coating layer is greater than a thickness of the inner hard coating layer, and wherein a stress neutral surface of the flexible display device is configured so that a compressive stress is applied to the inner hard coating layer in response to the flexible display device being bent.

The stress neutral surface may be disposed between the inner hard coating layer and the display panel.

A touch electrode layer may be disposed on the inner surface of the transparent substrate, wherein the inner hard coating layer may be disposed on an inner surface of the touch electrode layer.

The flexible display device may include a polarization panel disposed between the protective panel and the display panel.

A touch electrode layer may be disposed on at least one of an inner surface of the polarization panel and an outer surface of the polarization panel.

The flexible display device may include a touch panel including a base substrate configured to transmit light and a touch electrode layer, and wherein the touch panel may be disposed between the polarization panel and the protective panel.

The transparent substrate may include a polarization panel.

The outer hard coating layer and the inner hard coating layer may be respectively disposed on an outer surface of the polarization panel and an inner surface of the polarization panel.

A touch electrode layer may be disposed on an outer surface of the display panel.

A touch electrode layer may be disposed on an inner surface of the polarization panel.

The outer hard coating layer and the inner hard coating layer may be respectively disposed on an outer surface of the polarization panel and an inner surface of the touch electrode layer.

The at least one adhesive layer may include a plurality of rows that may include transparent fine particles that may be arranged in a width direction, which may be perpendicular to a direction in which the flexible display device folds.

The transparent fine particles may be configured so that the plurality of rows may be spaced apart from each other in the direction in which the flexible display device folds.

Portions that transmit light may be formed as a plurality of dot patterns configured to protrude toward the at least one adhesive layer, and may be disposed on at least one surface of two facing surfaces of two panels that may be attached to each other by using the at least one adhesive layer.

The display panel may include an electrode layer, wherein when a radius of curvature of the flexible display device is R, a distance between the stress neutral surface and the electrode layer may be configured to be less than or equal to 0.04 times R.

A distance between the stress neutral surface and the outer hard coating layer may be configured to be less than or equal to 0.07 times R.

At least one adhesive layer may include an adhesive layer configured to adhere the protective panel to another panel, wherein a distance between the stress neutral surface and the adhesive layer may be configured to be less than or equal to 0.03 times R.

A touch electrode layer may be configured to receive a touch input, wherein a distance between the stress neutral surface and the touch electrode layer may be configured to be less than or equal to 0.02 times R.

According to an aspect of another exemplary embodiment, there is provided a flexible display device including: a display panel configured to display an image; and a protective panel disposed outside the display panel and including a transparent substrate, an outer hard coating layer formed on an outer surface of the transparent substrate, and an inner hard coating layer formed on an inner surface of the transparent substrate, and each of the outer hard coating layer, and the inner hard coating layer has a hardness greater than a hardness of the transparent substrate, wherein the display panel includes an electrode layer, and wherein when a radius of curvature of the flexible display device is R, a distance between a stress neutral surface of the flexible display device and the electrode layer is configured to be less than or equal to 0.04 times R.

A distance between the stress neutral surface and the outer hard coating layer may be configured to be less than or equal to 0.07 times R.

The flexible display device may include an adhesive layer configured to adhere the protective panel to another panel, wherein a distance between the stress neutral surface and the adhesive layer may be configured to be less than or equal to 0.03 times R.

The flexible display device may include a touch electrode layer configured to receive a touch input, wherein a distance between the stress neutral surface and the touch electrode layer may be configured to be less than or equal to 0.02 times R.

The stress neutral surface may be configured so that a compressive stress may be applied to the inner hard coating layer in response to the flexible display device being bent.

According to an aspect of another exemplary embodiment, there is provided a flexible display device including: a plurality of panels including a display panel configured to display an image and a protective panel disposed outside the display panel; and at least one adhesive layer configured to adhere the plurality of panels to each other, wherein the at least one adhesive layer includes a plurality of rows including transparent fine particles that are arranged in a width direction, which is perpendicular to a direction in which the flexible display device folds.

The transparent fine particles may be arranged so that the plurality of rows may be spaced apart from each other in the direction in which the flexible display device folds.

According to an aspect of another exemplary embodiment, there is provided a flexible display device including: a plurality of panels including a display panel configured to display an image and a protective panel disposed outside the display panel; and at least one adhesive layer configured to adhere the plurality of panels to each other, wherein portions that transmit light are formed as a plurality of dot patterns configured to protrude toward the at least one adhesive layer, and are disposed on at least one surface of two facing surfaces of two panels that are attached to each other by using the at least one adhesive layer.

BRIEF DESCRIPTION OF THE DRAWINGS

These and/or other aspects will become apparent and more readily appreciated from the following description of one or more exemplary embodiments, taken in conjunction with the accompanying drawings in which.

DETAILED DESCRIPTION

Figure 1:
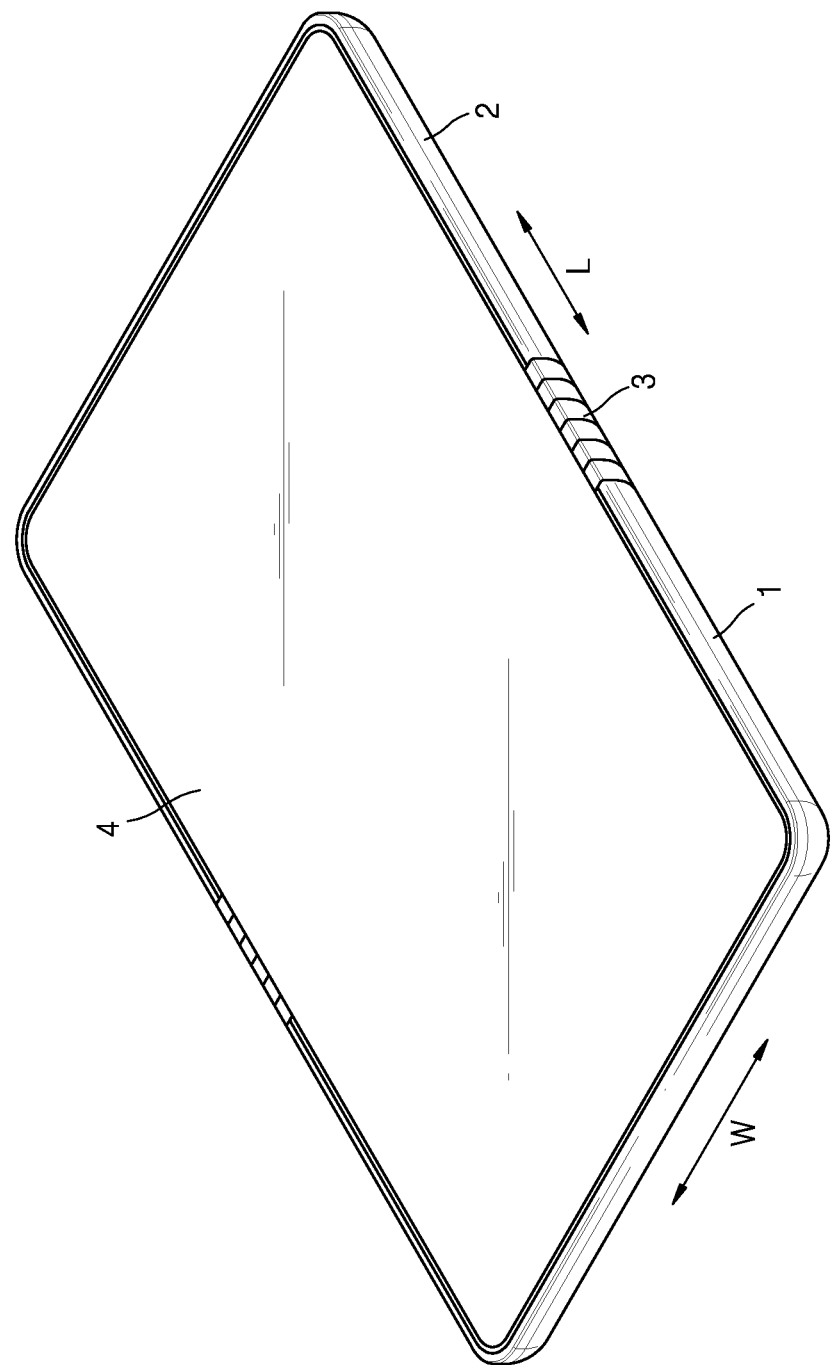
FIG. 1 is a perspective view illustrating an outer appearance of a foldable device according to an exemplary embodiment.

Reference will now be made in detail to exemplary embodiments, examples of which are illustrated in the accompanying drawings, wherein like reference numerals denote like elements throughout and sizes or thicknesses of elements may be exaggerated for clarity.

As used herein, the term "and/or" includes any and all combinations of one or more of the associated listed items. Expressions such as "at least one of" when preceding a list of elements, modify the entire list of elements and do not modify the individual elements of the list.

Figure 2:
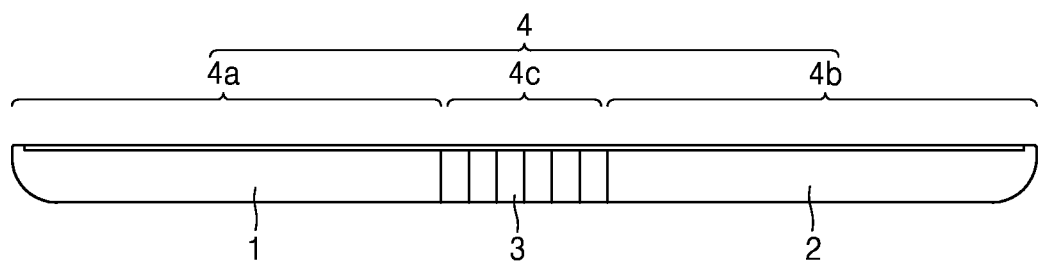
FIG. 2 is a side view illustrating a state in which the foldable device of FIG. 1 is unfolded according to an exemplary embodiment.
Figure 3:
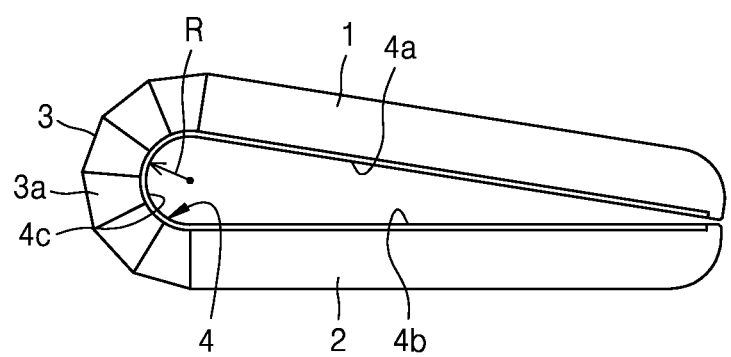
FIG. 3 is a side view illustrating a state in which the foldable device of FIG. 1 is folded according to an exemplary embodiment.

FIG. 1 is a perspective view illustrating an outer appearance of a foldable device according to an exemplary embodiment. FIG. 2 is a side view illustrating a state in which the foldable device of FIG. 1 is unfolded according to an exemplary embodiment. FIG. 3 is a side view illustrating a state in which the foldable device of FIG. 1 is folded according to an exemplary embodiment.

Referring to FIGS. 1 through 3, the foldable device includes bodies, a flexible display device 4, and a hinge unit 3. The bodies include first and second bodies 1 and 2. The flexible display device 4 is supported on the first body 1 and the second body 2. For example, the flexible display device 4 may be adhered to the first body 1 and the second body 2 by using an adhesive unit such as an adhesive or a double-sided tape. The hinge unit 3 is arranged between the first body 1 and second body 2 and foldably connects the first and second bodies 1 and 2. A folding/unfolding direction in which the first and second bodies 1 and 2 fold/unfold is a longitudinal direction L.

The foldable device may be a portable mobile device such as a communication terminal, a game console, a multimedia device, a portable computer, or a photographing apparatus. Exemplary embodiments are not limited thereto. The foldable device may be any device that includes a first body 1 on which a first part 4a of the flexible display device 4 is supported and a second body 2 on which a second part 4b of the flexible display device 4 is supported and which is foldably connected to the first body 1 by the hinge unit 3.

A processing unit (e.g., processor) and input/output units (e.g., interfaces) for performing functions according to the use of the foldable device may be provided on the first and second bodies 1 and 2. When the foldable device is a multimedia terminal that provides images and/or music, the processing unit may include an image information processing unit and an audio information processing unit. When the foldable device is a communication terminal, the processing unit may include a communication module. The input/output units may include an image input/output unit, an audio input/output unit, and a manipulation unit for user manipulation.

The flexible display device 4 may be divided into a first part 4a that is coupled to the first body 1, a second part 4b that is coupled to the second body 2, and a third part 4c that is formed between the first body 1 and the second body 2. The third part 4c of the flexible display device 4 is not fixed to the hinge unit 3. When the third part 4c of the flexible display device 4 is bent, the foldable device may be folded as shown in FIG. 3. When the foldable device is folded, the hinge unit 3 is arranged outside the flexible display device 4 and forms a curved portion 3a having a predetermined curvature as shown in FIG. 3. In this state, the hinge unit 3 may not be bent further and may hinder the third part 4c of the flexible display device 4 from being bent too sharply, thereby protecting the display. The hinge unit 3 may have any of various structures for foldably connecting the first and second bodies 1 and 2. For example, the hinge unit 3 may have a structure that is flexibly bent or a chain structure in which a plurality of segmental members are pivotably connected to one another.

Figure 4:
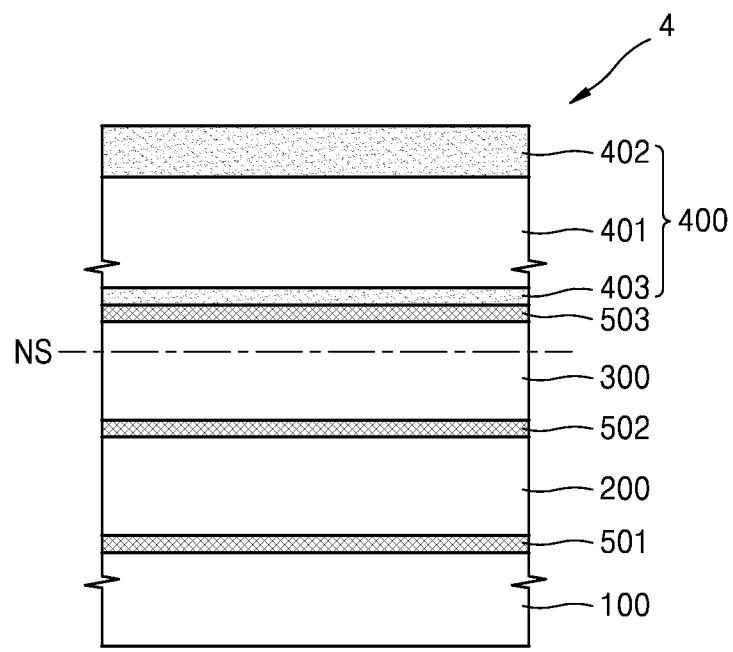
FIG. 4 is a cross-sectional view of a flexible display device according to an exemplary embodiment.

FIG. 4 is a cross-sectional view of the flexible display device 4 according to an exemplary embodiment. Referring to FIG. 4, the flexible display device 4 includes a plurality of panels that are stacked on one another. The plurality of panels include a display panel 100 that displays an image. The plurality of panels may further include, for example, a polarization panel 200, a touch panel 300, and a protective panel 400. The display panel 100, the polarization panel 200, the touch panel 300, and the protective panel 400 are sequentially attached to one another by using, for example, an optically-clear adhesive (OCA) layer.

Figure 5:
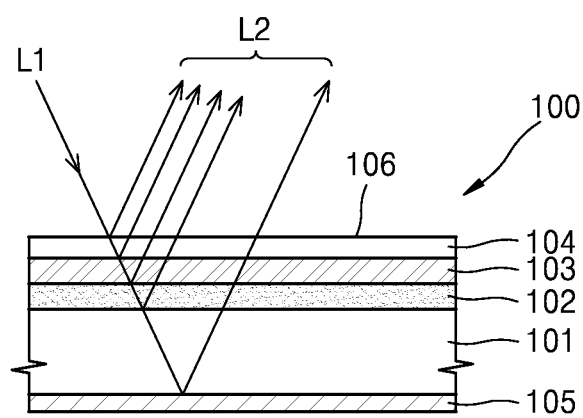
FIG. 5 is a cross-sectional view of an active-matrix organic light-emitting diode (AMOLED) panel according to an exemplary embodiment.

The display panel 100 may be, for example, an active-matrix organic light-emitting diode (AMOLED) panel. FIG. 5 is a cross-sectional view of the AMOLED panel according to an exemplary embodiment.

Referring to FIG. 5, the display panel 100 may include a driving substrate 101 in which a driving device array (e.g., a thin-film transistor (TFT) array) is arranged, an organic electroluminescent layer 102, a cathode electrode layer 103, and an encapsulation layer 104. A color filter layer may be further arranged between the organic electroluminescent layer 102 and the encapsulation layer 104. A reflective layer 105 for reflecting light toward the encapsulation layer 104, that is, toward a light-emitting surface 106, may be provided under the driving substrate 101.

Because the AMOLED panel is a self-emissive display panel in which the organic electroluminescent layer 102 generates light by using a driving signal, a separate light source (e.g., a backlight) may not be necessary. Accordingly, the AMOLED panel may be manufactured as a pliable film that is thinner than a liquid crystal display (LCD) panel.

The polarization panel 200 is used to prevent glare or a reduction in a contrast ratio which occurs when external light is incident on the display panel 100 and then is reflected from the display panel 100. When there is no polarization panel 200, as shown in FIG. 5, external light L1 that is incident from the outside on the display panel 100 is reflected from a surface layer of the display panel 100, e.g., the light-emitting surface 106, and each layer of the display panel 100 and the reflective layer 105 that is a lowermost layer of the display panel 100 and then is emitted back as reflected light L2 to the outside. The reflected light L2 reduces a contrast ratio of an image and causes glare. The polarization panel 200 is an anti-reflection panel that prevents or reduces the reflected light L2 of the external light L1.

Figure 6:
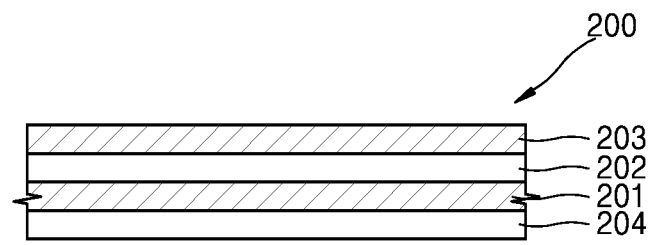
FIG. 6 is a cross-sectional view of a polarization panel according to an exemplary embodiment.

FIG. 6 is a cross-sectional view of the polarization panel 200 according to an exemplary embodiment. Referring to FIG. 6, the polarization panel 200 may include a linear polarizer 202, an upper support plate 203 and a lower support plate 201 that support the linear polarizer 202, and a λ/4 phase plate 204. The linear polarizer 202 may be, for example, a polyvinyl alcohol (PVA) film. The upper support plate 203 and the lower support plate 201 may be, for example, tri-acetyl-cellulose (TAC) films. The λ/4 phase plate 204 may be adhered to the lower support plate 201 by using an OCA layer. Exemplary embodiments are not limited to these types. The linear polarizer 202 linearly polarizes the external light L1. The λ/4 phase plate 204 circularly polarizes linearly polarized light and linearly polarizes circularly polarized light. An operation of the polarization panel 200 is described below.

When the external light L1 that is unpolarized light passes through the linear polarizer 202, the external light L1 is converted into, for example, horizontally polarized light. When the horizontally polarized light passes through the λ/4 phase plate 204, the horizontally polarized light is converted into, for example, left-circularly polarized light. When the left-circularly polarized light is incident on the display panel 100 and is reflected from the surface layer of the display panel 100, each layer of the display panel 100, and the reflective layer 105 that is the lowermost layer of the display panel 100, the left-circularly polarized light is converted into right-circularly polarized light. When the right-circularly polarized light passes through the λ/4 phase plate 204, the right-circularly polarized light is converted back into linearly polarized light. In this case, a polarization direction of the linearly polarized light is, for example, a vertical direction. The linearly polarized light for which a polarization direction is a vertical direction does not pass through the linear polarizer 202, is reflected back inward, and is not emitted from the polarization panel 200. As such, because the polarization panel 200 reduces or removes the reflected light L2, glare may be reduced and a reduction in a contrast ratio may be prevented. Exemplary embodiments are not limited to a structure of the polarization panel 200 in FIG. 6, and the polarization panel 200 may further include various optical layers for improving the performance of the display panel 100, for example, a phase difference compensating layer and a viewing angle correcting layer. The polarization panel 200 including the various optical layers may be manufactured as a pliable film.

Figure 7:
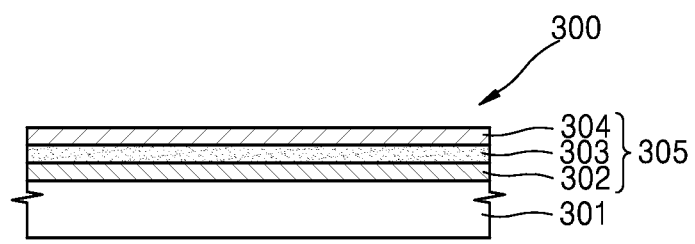
FIG. 7 is a cross-sectional view of a capacitive touch panel according to an exemplary embodiment.

FIG. 7 is a cross-sectional view of the touch panel 300 that is a capacitive touch panel according to an exemplary embodiment. The touch panel 300 is a manipulation unit that receives a user input. Resistive touch panels or capacitive touch panels are used in mobile devices. Referring to FIG. 7, the touch panel 300 may include a base substrate 301 that is a light-transmitting base substrate and a touch electrode layer 305 that is a light-transmitting touch electrode layer. The touch electrode layer 305 may include first and second electrode layers 302 and 304, and a dielectric layer 303 that is disposed between the first and second electrode layers 302 and 304.

The first electrode layer 302 may be formed by forming as a patterned thin film a conductive metal such as indium tin oxide (ITO), copper metal mesh, or silver nanowires on the base substrate 301 by using vacuum deposition, sputtering, or plating, etc. The dielectric layer 303 may be formed on the first electrode layer 302, and the second electrode layer 304 may be formed by forming as a patterned thin film a conductive metal on the dielectric layer 303 by using vacuum deposition, sputtering, or plating, etc. For example, the first electrode layer 302 may include a plurality of horizontal electrodes, and the second electrode layer 304 may include a plurality of vertical electrodes. Touch cells are formed at intersections between the horizontal electrodes and the vertical electrodes. The horizontal electrodes may be, for example, driving electrodes, and the vertical electrodes may be, for example, receiving electrodes. When a touching object, for example, a user's hand or a touch pen (e.g., stylus) approaches or contacts the touch panel 300, a change in a capacitance of a touch cell occurs, and whether a touch event occurs and a position of the touch cell may be detected by detecting the change in the capacitance. Also, the touch panel 300 may be formed so that the first and second electrode layers 302 and 304 are formed on a top surface and a bottom surface of the base substrate 301, respectively. Also, the touch panel 300 may be formed so that two substrates on which electrode layers are formed are bonded to each other. The touch panel 300 may be manufactured as a pliable light-transmitting film.

Figure 8:
FIG. 8 is a cross-sectional view of a protective panel according to an exemplary embodiment.

FIG. 8 is a cross-sectional view of the protective panel 400 according to an exemplary embodiment. The protective panel 400 acts as an outermost layer of the flexible display device 4. Referring to FIG. 8, the protective panel 400 protects the flexible display device 4 from external impact, scratches, etc. The protective panel 400 includes a transparent substrate 401 that is pliable. The transparent substrate 401 may be, for example, a polyethylene terephthalate (PET) film. The protective panel 400 includes an outer hard coating layer 402 for protecting the flexible display device 4 from scratches. The outer hard coating layer 402 is formed on an outer surface of the transparent substrate 401. The outer hard coating layer 402 may have a hardness that is equal to or greater than, for example, 1 H that is a hardness of a pencil.

As a thickness of the outer hard coating layer 402 increases, a scratch resistance is increased. However, a compressive stress is increased when the flexible display device 4 folds as shown in FIG. 3, thereby making the outer hard coating layer 402 break. The protective panel 400 may be warped due to a difference between physical properties of the outer hard coating layer 402 and the transparent substrate 401. Also, although a surface of the protective panel 400 has anti-scratch performance due to the outer hard coating layer 402, the performance of the flexible display device 4 may be affected by adhesive layers 501, 502, and 503 that are soft and are used to bond optical panels constituting the flexible display device 4. For example, when the surface of the protective panel 400 is pressed by using the user's hand or the touch pen, the adhesive layers 501, 502, and 503 that are relatively pliable may be pressed and may not be restored, thereby causing an image displayed on the display panel 100 to be distorted.

In this regard, the protective panel 400 may further include an inner hard coating layer 403. That is, the outer hard coating layer 402 is formed on an outer surface of the transparent substrate 401 and the inner hard coating layer 403 is formed on an inner surface of the transparent substrate 401. The inner hard coating layer 403 may have a hardness that is equal to or greater than, for example, 1 H that is a hardness of a pencil.

The outer and inner hard coating layers 402 and 403 may be formed by using an organic/inorganic hybrid coating material. Both a sufficient hardness and a sufficient softness may be ensured according to the amount or property of organic and inorganic (e.g., $SiO_2$ and $Al_2O_3$) molecular structures constituting the organic/inorganic hybrid coating material. For example, the amount of inorganic network structures that affect a hardness and a softness is adjusted by adjusting the property and amount of organic cross-linked structures. The organic/inorganic hybrid material may be prepared by using a sol-gel process involving hydrolysis and condensation reaction by adding an organic material to an inorganic precursor and making them react to each other. The organic/inorganic hybrid coating material is applied to a plastic substrate (for example, the transparent substrate 401), and then ultraviolet or thermal curing is performed.

Examples of a method of forming hard coating layers having different thicknesses on both surfaces of the transparent substrate 401 may include a method of forming coating layers on both surfaces of the transparent substrate 401 and reducing a thickness of one surface through polishing or grinding. Also, the examples may include a method of performing hard coating on one surface to a desired thickness in a state in which the other surface is masked and then performing coating on the other surface that has not been coated to a desired thickness in a state in which the one surface on which the hard coating has been performed is masked.

Because the inner hard coating layer 403 is included, image distortion which may occur when the adhesive layers 501, 502, and 503 are pressed may be reduced. However, assuming that sums of thicknesses of the inner hard coating layer 403 and the outer hard coating layer 402 are the same, because pressed amounts of the adhesive layers 501, 502, and 503 when the thickness of the inner hard coating layer 403 is too great are greater than those when only the outer hard coating layer 402 is provided, image distortion when the thickness of the inner hard coating layer 403 is too great is hardly reduced. In general, the pressed amount of the adhesive layer 503 which is the closest to the protective panel 400 is the greatest.

Figure 9:
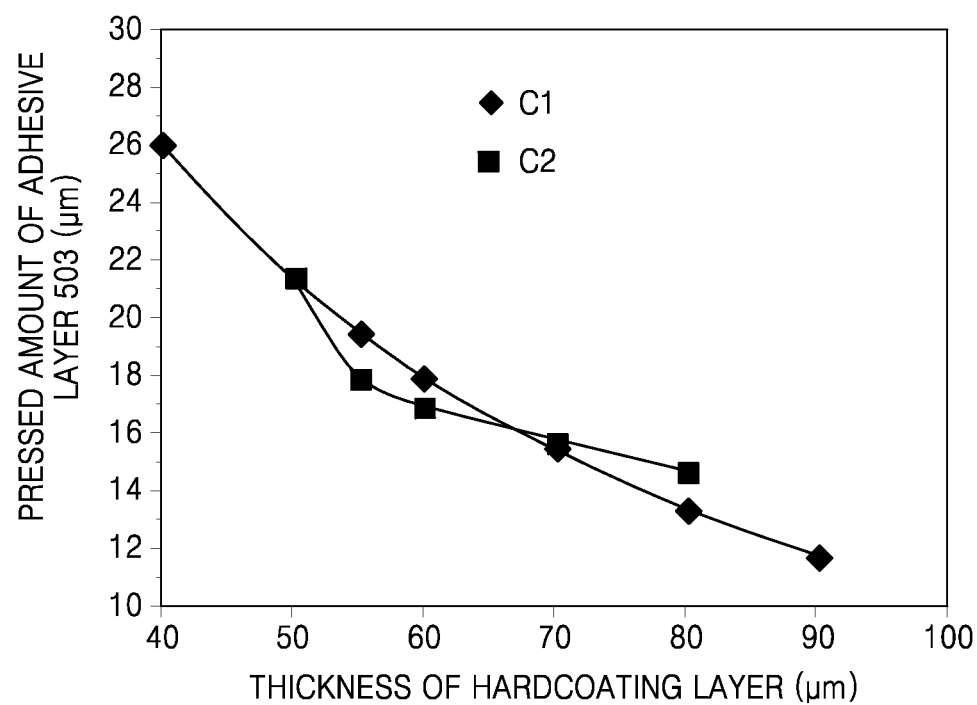
FIG. 9 is a simulation graph showing a relationship between a pressed amount of an adhesive layer and a total thickness of an outer hard coating layer and an inner hard coating layer, according to an exemplary embodiment.

FIG. 9 is a simulation graph showing a relationship between a pressed amount of the adhesive layer 503 and a total thickness of the outer hard coating layer 402 and the inner hard coating layer 403. C1 shows a relationship between a pressed amount of the adhesive layer 503 and a thickness of the outer hard coating layer 402 when the protective panel 400 includes only the outer hard coating layer 402. C2 shows a relationship between a pressed amount of the adhesive layer 503 and a thickness of the inner hard coating layer 403 when the protective panel 400 includes the inner hard coating layer 403 and the outer hard coating layer 402 having a thickness of 50 μm. That is, C2 shows a pressed amount of the adhesive layer 503 when a thickness of the inner hard coating layer 403 ranges from 0 μm to 30 μm.

Referring to C1 of FIG. 9, a pressed amount of the adhesive layer 503 decreases as a thicknesses of the outer hard coating layer 402 increases. Referring to C2 of FIG. 9, in a first range, a pressed amount of the adhesive layer 503 when the inner hard coating layer 403 is provided is less than that when only the outer hard coating layer 402 is provided. A range in which a sum of thicknesses of the outer and inner hard coating layers 402 and 403 range from 50 μm to 65 μm, that is, a range in which the thickness of the inner hard coating layer 403 ranges from 0 μm to 15 μm (because the thickness of the outer hard coating layer 402 is 50 μm) corresponds to the first range. However, in a second range in which the thickness of the inner hard coating layer 403 exceeds the first range, a pressed amount of the adhesive layer 503 is greater than that when only the outer hard coating layer 402 is provided. Accordingly, it may be preferable that the thickness of the inner hard coating layer 403 is less than that of the outer hard coating layer 402.

Also, when a member having a flat plate shape, such as the flexible display device 4, is bent, an inner surface is compressed and an outer surface is in tension about a boundary surface between the inner surface and the outer surface of the member. The boundary surface for which a length remains constant is referred to as a stress neutral surface (NS) (see FIG. 4). When the flexible display device 4 is bent and the NS is disposed between the outer hard coating layer 402 and the inner hard coating layer 403, a compressive stress is applied to the outer hard coating layer 402 and a tensile stress is applied to the inner hard coating layer 403. Once the tensile stress is applied to the inner hard coating layer 403, the inner hard coating layer 403 may easily break. Hence, the NS may be disposed under the protective panel 400 so that no tensile stress is applied to the protective panel 400. Also, each of the layers constituting the display panel 100 that displays an image may be under only one of a compressive stress and a tensile stress. To this end, the NS may be disposed between the protective panel 400 and the display panel 100.

Figure 10:
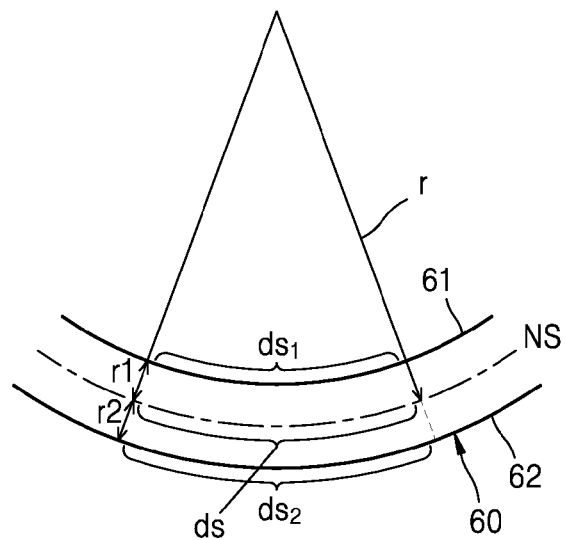
FIG. 10 is a view illustrating a state in which a member having a flat plate shape is bent, according to an exemplary embodiment.

FIG. 10 is a view illustrating a state in which a member 60 having a flat plate shape is bent. Referring to FIG. 10, when an NS of the member 60 is bent to have a radius of curvature r, strains of an inner surface 61 and an outer surface 62 are respectively ∈1 and ∈2, and a yield strain of the member 60 having the flat plate shape is $\in_Y$, and $$dS = rd\theta,$$
$$dS_1 = (r - r1)d\theta, \text{ and}$$
$$dS_2 = (r + r2)d\theta,$$

$$|\varepsilon 1| = \left|\frac{ds_1 - ds}{ds}\right| = \left|\frac{-r1}{r}\right| \langle \varepsilon_Y, r \rangle \frac{r1}{\varepsilon_Y} \text{ and} \quad (1)$$

$$|\varepsilon 2| = \left|\frac{ds_2 - ds}{ds}\right| = \left|\frac{r2}{r}\right| \langle \varepsilon_Y, r \rangle \frac{r2}{\varepsilon_Y}. \quad (2)$$

Figure 11:
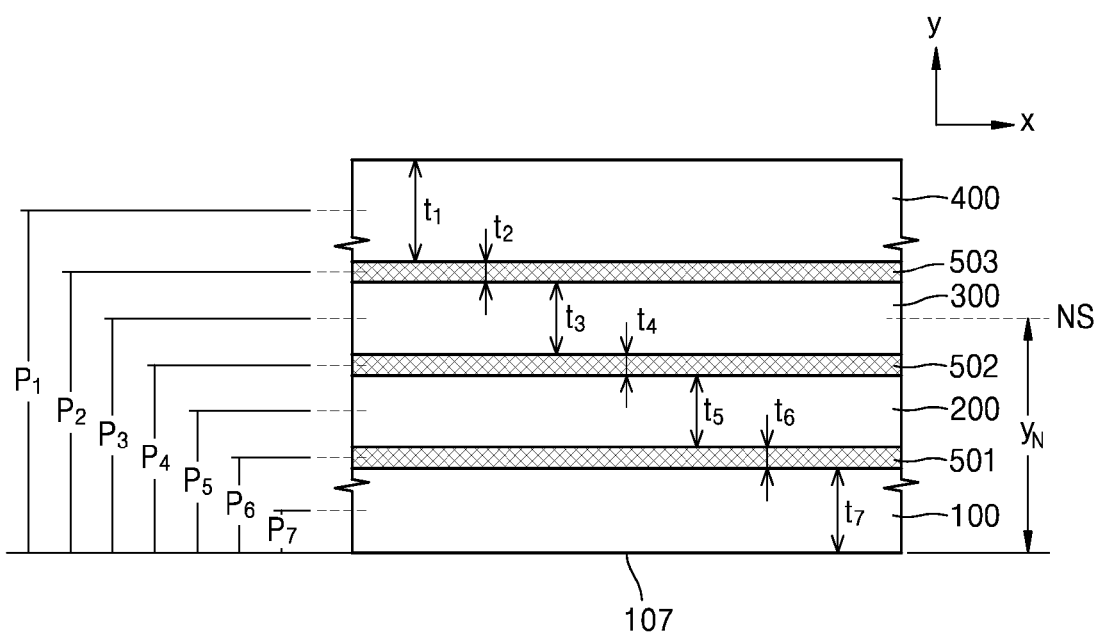
FIG. 11 is a reference view illustrating a process of obtaining a height of a neutral surface, according to an exemplary embodiment.

A height $y_N$ of the NS of the flexible display device 4 of FIG. 4 will now be obtained. FIG. 11 is a reference view illustrating a process of obtaining the height $y_N$ of the NS. Referring to FIG. 11, $T_1$, $T_2$, $T_3$, $T_4$, $T_5$, $T_6$, and $T_7$ are thicknesses of the protective panel 400, the adhesive layer 503, the touch panel layer 300, the adhesive layer 502, the polarization panel 200, the adhesive layer 501, and the display panel 100, respectively. $P_1$, $P_2$, $P_3$, $P_4$, $P_5$, $P_6$, and $P_7$ are distances between an inner surface 107 of the display panel 100 and central surfaces of the protective panel 400, the adhesive layer 503, the touch panel layer 300, the adhesive layer 502, the polarization panel 200, the adhesive layer 501, and the display panel 100, respectively, in thickness directions thereof. The height $y_N$ is a distance between the NS and an inner surface 107 of the display panel 100. $E_1$, $E_2$, $E_3$, $E_4$, $E_5$, $E_6$, and $E_7$ are elastic moduli of the protective panel 400, the adhesive layer 503, the touch panel layer 300, the adhesive layer 502, the polarization panel 200, the adhesive layer 501, and the display panel 100, respectively.

When the flexible display device 4 is bent so that the NS has the radius of curvature r, a stress $\sigma_i$ at a position in which a distance from the NS is y is $$\sigma_i = E_i \varepsilon_i(y) = E_i \frac{y}{r}.$$

Referring to Equations 1 and 2, $$\varepsilon_i(y) = \frac{y}{r}, \quad (3)$$

$$\sigma_i = E_i \frac{y}{r}.$$

Because the NS is defined as a surface on which a sum of forces applied in an x-direction is '0', when the stress $\sigma_i$ is integrated with respect to an area A to which the stress $\sigma_i$ is applied, $$\sum_i \int_i \sigma_i \, dA = 0. \quad (4)$$

When Equation 3 is applied to Equation 4, $$\sum_i E_i \int_i y \, dA = \sum_i \left[ E_i \int_i (y + y_N) dA - E_i \int_i y_N dA \right] = 0. \quad (5)$$

When Equation 5 is solved, $$\sum_i [E_i P_i T_i] - y_N \sum_i [E_i T_i] = 0. \quad (6)$$

The height $y_N$ of the NS is $$y_N = \frac{\sum_i [E_i P_i T_i]}{\sum_i [E_i T_i]}. \quad (7)$$

Accordingly, the height $y_N$ of the NS in FIG. 11 is $$y_N = \frac{E_1 P_1 T_1 + E_2 P_2 T_2 + E_3 P_3 T_3 + E_4 P_4 T_4 + E_5 P_5 T_5 + E_6 P_6 T_6 + E_7 P_7 T_7}{E_1 T_1 + E_2 T_2 + E_3 T_3 + E_4 T_4 + E_5 T_5 + E_6 T_6 + E_7 T_7}. \quad (8)$$

An elastic modulus and a thickness of each layer are determined so that a position of the NS that is calculated by using Equation 7 or Equation 8 is lower than that of the inner hard coating layer 403. Accordingly, a tensile stress may not be applied to the protective panel 400. Furthermore, a position of the NS may be determined so that the NS is disposed between the display panel 100 and the protective panel 400.

As the adhesive layers 501, 502, and 503 are more pliable, the flexible display device 4 is more pliably bent. However, when the adhesive layers 501, 502, and 503 are pressed and then are not restored as described above, an image may be distorted. Therefore, a thicknesses of the adhesive layers 501, 502, and 503 may be reduced. However, adhesive force may be reduced if thicknesses of the adhesive layers 501, 502, and 503 are reduced.

One or more of the adhesive layers 501, 502, and 503 may not be restored after a pressing force is released. According to a simulation, a pressed amount of the adhesive layer 503 which is disposed under the protective panel 400 is the greatest. Also, a pressed amount of the adhesive layer 503 is more dependent on a sum of thicknesses of the adhesive layers 501, 502, and 503 than on a thickness of each of the adhesive layers 501, 502, and 503 of the flexible display device 4. In other words, even when a thickness of each of the adhesive layers 501, 502, and 503 is changed, if a sum of thicknesses of the adhesive layers 501, 502, and 503 is the same, a pressed amount of the adhesive layer 503 is hardly changed. Accordingly, to reduce a total thickness of adhesive layers, one or more of the adhesive layers 501, 502, and 503 may be removed. The probability that a layer is pressed and not restored may be reduced by reducing a number of adhesive layers. To this end, one or two of the panels 100, 200, 300, and 400 may be integrated. Methods of reducing a number of the adhesive layers 501, 502, and 503 will be described below.

Figure 12:
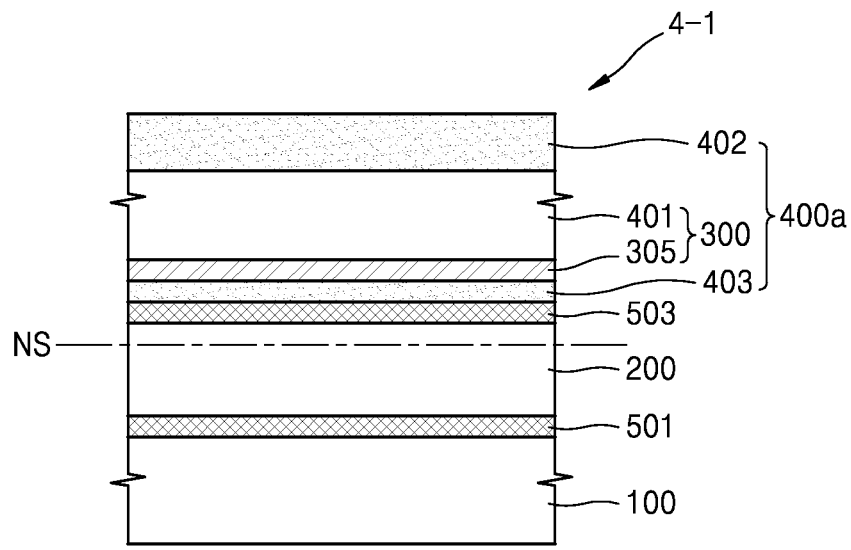
FIG. 12 is a cross-sectional view of a flexible display device having a structure in which the touch panel is integrated with the protective panel, according to an exemplary embodiment.

FIG. 12 is a cross-sectional view of a flexible display device 4-1 according to an exemplary embodiment. The flexible display device 4-1 has a structure in which the touch panel 300 is integrated into a protective panel 400a. Referring to FIG. 12, the transparent substrate 401 acts as the base substrate 301 of FIG. 7. That is, the touch electrode layer 305 is directly formed on an inner surface of the transparent substrate 401, and the inner hard coating layer 403 is formed on a bottom surface, that is, an inner surface of the touch electrode layer 305. A structure of the touch electrode layer 305 is the same as that of FIG. 7. The structure of the touch electrode layer 305 may vary according to a method of the touch panel 300 as described above.

For example, the first electrode layer 302 may be formed by forming as a patterned thin film a conductive metal such as ITO on the inner surface of the transparent substrate 401 by using vacuum deposition, sputtering, or plating, etc. The dielectric layer 303 may be formed on an inner surface of the first electrode layer 302, and the second electrode layer 304 may be formed as a patterned thin film by forming a conductive metal such as ITO on an inner surface of the dielectric layer 303 by using vacuum deposition, sputtering, or plating, etc. In this state, the outer hard coating layer 402 is formed on an outer surface of the transparent substrate 401, and the inner hard coating layer 403 is formed on an inner surface of the second electrode layer 304.

According to an exemplary embodiment, the protective panel 400a into which the touch panel 300 is integrated is adhered to the polarization panel 200 by using the adhesive layer 503. Accordingly, the adhesive layer 502 (see FIG. 4) may be omitted.

In FIG. 12, an elastic modulus and a thickness of each layer are determined so that a position of the NS that is calculated by using Equation 7 or Equation 8 is lower than that of the inner hard coating layer 403. Accordingly, a tensile stress may not be applied to the protective panel 400. Also, the outer hard coating layer 402 is thicker than the inner hard coating layer 403.

Figure 13:
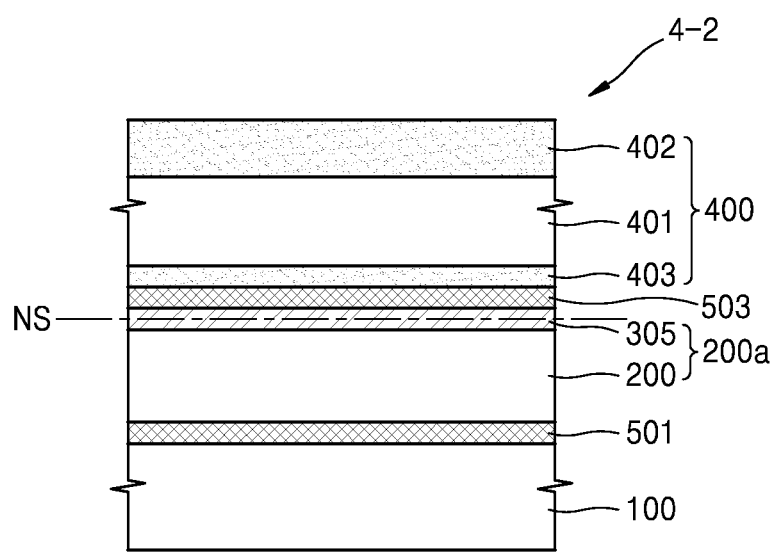
FIG. 13 is a cross-sectional view of a flexible display device having a structure in which the touch panel is integrated with the polarization panel, according to an exemplary embodiment.

FIG. 13 is a cross-sectional view of a flexible display device 4-2 according to an exemplary embodiment. The flexible display device 4-2 has a structure in which the touch panel 300 is integrated into a polarization panel 200a. Referring to FIG. 13, the polarization panel 200 acts as the base substrate 301 of FIG. 7. That is, the touch electrode layer 305 is directly formed on a surface of the polarization panel 200. A structure of the polarization panel 200 may be the same as that of FIG. 6. A structure of the touch electrode layer 305 is the same as that of FIG. 7. The structure of the touch electrode layer 305 may vary according to a method of the touch panel 300 as described above.

For example, the first electrode layer 302 may be formed by forming as a patterned thin film a conductive metal such as ITO on an outer surface of the polarization panel 200 by using vacuum deposition, sputtering, or plating, etc. The dielectric layer 303 may be formed on an outer surface of the first electrode layer 302, and the second electrode layer 304 may be formed by forming as a patterned thin film a conductive metal such as ITO on an outer surface of the dielectric layer 303 by using vacuum deposition, sputtering, or plating, etc. In this state, the polarization panel 200a into which the touch panel 300 is integrated is adhered to the display panel 100 by using the adhesive layer 501, and the protective panel 400 is attached to the polarization panel 200a by using the adhesive layer 503. Accordingly, the adhesive layer 502 (see FIG. 4) may be omitted.

Figure 14:
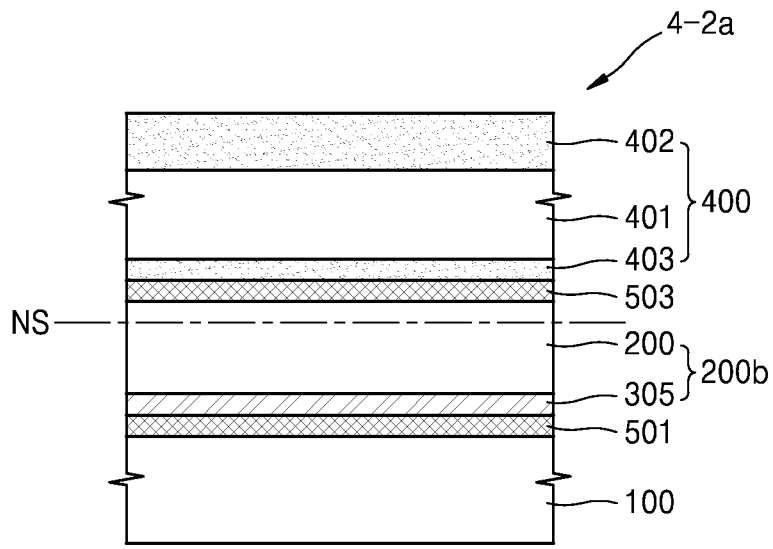
FIG. 14 is a cross-sectional view of a flexible display device having a structure in which the touch panel is integrated with the polarization panel, according to an exemplary embodiment.

FIG. 14 is a cross-sectional view of a flexible display device 4-2a according to an exemplary embodiment. The flexible display device 4-2a has a structure in which the touch panel 300 is integrated into a polarization panel 200b. The flexible display device 4-2a is different from the flexible display device 4-2 of FIG. 13 in that the touch electrode layer 305 is formed on an inner surface of the polarization panel 200.

In FIGS. 13 and 14, an elastic modulus and a thickness of each layer are determined so that a position of the NS that is calculated by using Equation 7 or Equation 8 is lower than that of the inner hard coating layer 403. Accordingly, a tensile stress may not be applied to the protective panel 400. Also, the outer hard coating layer 402 is thicker than the inner hard coating layer 403.

Figure 15:
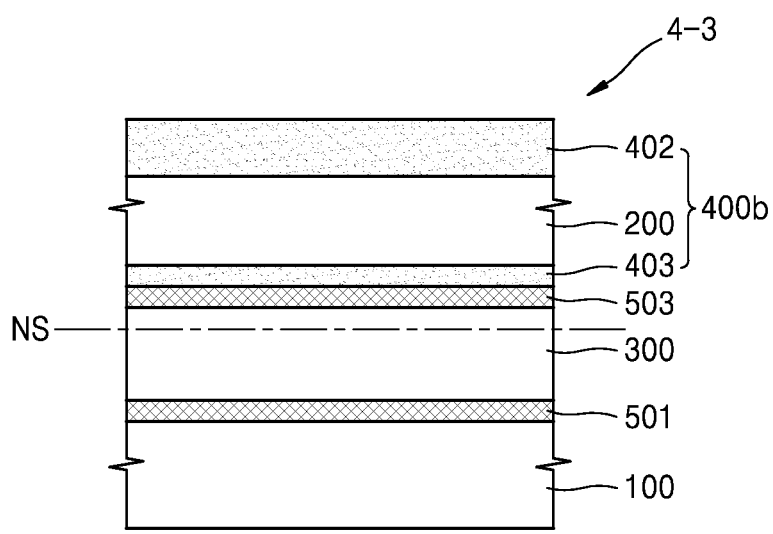
FIG. 15 is a cross-sectional view of a flexible display device having a structure in which the polarization panel is integrated with the protective panel, according to an exemplary embodiment.

FIG. 15 is a cross-sectional view of a flexible display device 4-3 according to an exemplary embodiment. The flexible display device 4-3 has a structure in which the polarization panel 200 is integrated into a protective panel 400b. Referring to FIG. 15, the polarization panel 200 acts as the transparent substrate 401 of FIG. 8. That is, the protective panel 400b including the outer hard coating layer 402 and the inner hard coating layer 403 that are respectively formed on an outer surface and an inner surface of the polarization panel 200 is adhered to the touch panel 300 by using the adhesive layer 503. A structure of the polarization panel 200 may be the same as that of FIG. 6.

A method of respectively forming the outer hard coating layer 402 and the inner hard coating layer 403 on the outer surface and the inner surface of the polarization panel 200 may be a method using an organic/inorganic hybrid material and a sol-gel process, like a method of forming the outer hard coating layer 402 and the inner hard coating layer 403 on both surfaces of the transparent substrate 401. A method of forming hard coating layers on the outer surface and the inner surface of the polarization panel 200 may be modified in various ways. Optical films constituting the polarization panel 200, for example, the linear polarizer 202, the upper support plate 203 and the lower support plate 201 that support the linear polarizer 202, and the λ/4 phase plate 204 may be bonded to one another, and then hard coating layers may be respectively formed on a top surface of an uppermost optical film and a bottom surface of a lowermost optical film. Also, a hard coating layer may be formed on a top surface of an uppermost optical film and a hard coating layer may be formed on a bottom surface of a lowermost optical film, and then optical films may be bonded to one another.

In this configuration, the adhesive layer 502 (see FIG. 4) may be omitted.

In FIG. 15, an elastic modulus and a thickness of each layer are determined so that a position of the NS that is calculated by using Equation 7 or Equation 8 is lower than that of the inner hard coating layer 403. Accordingly, a tensile stress may not be applied to the protective panel 400. Also, the outer hard coating layer 402 is thicker than the inner hard coating layer 403.

Figure 16:
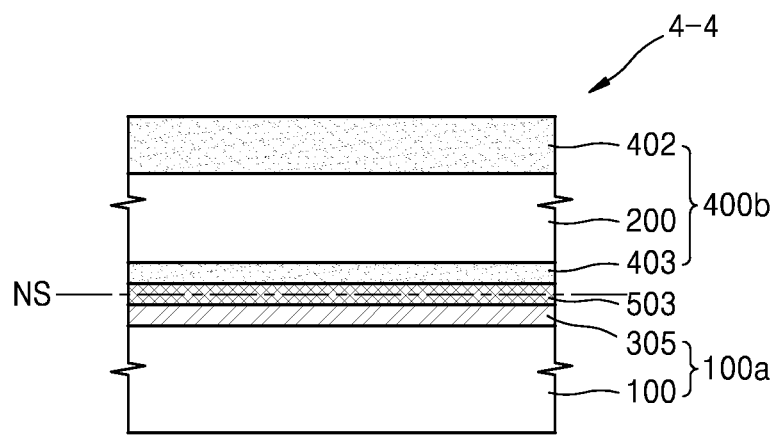
FIG. 16 is a cross-sectional view of a flexible display device having a structure in which the polarization panel is integrated with the protective panel and the touch panel is integrated with a display panel, according to an exemplary embodiment.

FIG. 16 is a cross-sectional view of a flexible display device 4-4 according to an exemplary embodiment. The flexible display device 4-4 has a structure in which the polarization panel 200 is integrated into the protective panel 400b and the touch panel 300 is integrated into a display panel 100a. Referring to FIG. 16, the polarization panel 200 acts as the transparent substrate 401 of FIG. 8. That is, the outer hard coating layer 402 and the inner hard coating layer 403 are respectively formed on an outer surface and an inner surface of the polarization panel 200. A structure of the polarization panel 200 may be the same as that of FIG. 6. The protective panel 400b into which the polarization panel 200 is integrated may be manufactured by using a process of FIG. 15.

Also, the display panel 100 acts as the base substrate 301 of FIG. 7. A structure of the display panel 100 may be the same as that of FIG. 5. The touch electrode layer 305 may be formed on a surface of an outermost layer of the display panel 100, for example, on a surface of the encapsulation layer 104, or when there is a protective layer outside the encapsulation layer 104, on a surface of the protective layer. For example, the first electrode layer 302 may be formed by forming as a patterned thin film a conductive metal such as ITO on an outer surface of the display panel 100, that is, on a surface of the encapsulation layer 104, by using vacuum deposition, sputtering, or plating, etc. The dielectric layer 303 may be formed on an outer surface of the first electrode layer 302, and the second electrode layer 304 may be formed by forming as a patterned thin film a conductive metal such as ITO on an outer surface of the dielectric layer 303 by using vacuum deposition, sputtering, or plating.

The display panel 100a is adhered to the protective panel 400b by using the adhesive layer 503, to form the flexible display device 4-4. Accordingly, the adhesive layers 501 and 502 (see FIG. 4) may be omitted.

In FIG. 16, an elastic modulus and a thickness of each layer are determined so that a position of the NS that is calculated by using Equation 7 or Equation 8 is lower than that of the inner hard coating layer 403. Accordingly, a tensile stress may not be applied to the protective panel 400. Also, the outer hard coating layer 402 is thicker than the inner hard coating layer 403.

Figure 17:
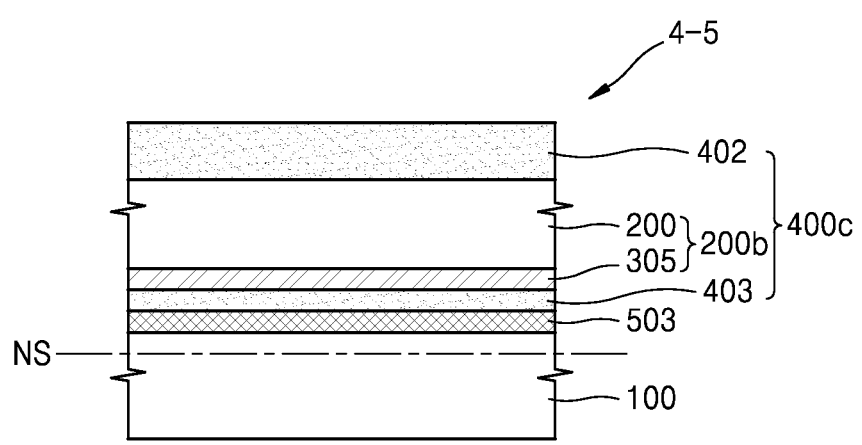
FIG. 17 is a cross-sectional view of a flexible display device having a structure in which the touch panel and the polarization panel are integrated with the protective panel, according to an exemplary embodiment.

FIG. 17 is a cross-sectional view of a flexible display device 4-5 according to an exemplary embodiment. The flexible display device 4-5 has a structure in which the touch panel 300 and the polarization panel 200 are integrated into a protective panel 400c. Referring to FIG. 17, the polarization panel 200b into which the touch panel 300 is integrated acts as the transparent substrate 401 of FIG. 8. That is, the touch electrode layer 305 is directly formed on an inner surface of the polarization panel 200. A structure of the polarization panel 200 may be the same as that of FIG. 6. A structure of the touch electrode layer 305 may be the same as that of FIG. 7. The outer hard coating layer 402 and the inner hard coating layer 403 are respectively formed on a top surface and a bottom surface of the polarization panel 200b.

The protective panel 400c is adhered to the display panel 100 by using the adhesive layer 503. Accordingly, the adhesive layers 501 and 502 (see FIG. 4) may be omitted.

In FIG. 17, an elastic modulus and a thickness of each layer are determined so that a position of the NS that is calculated by using Equation 7 or Equation 8 is lower than that of the inner hard coating layer 403. Accordingly, a tensile stress may not be applied to the protective panel 400. Also, the outer hard coating layer 402 is thicker than the inner hard coating layer 403.

According to one or more exemplary embodiments of FIGS. 12 through 17, a number of adhesive layers may be reduced by integrating two or three of a plurality of panels. Accordingly, a risk of image distortion which occurs when the adhesive layers are pressed may be reduced.

To reduce the possibility that a layer is pressed and then not restored, an elastic modulus of each of the adhesive layers 501, 502, and 503 may be increased.

Figure 18A:
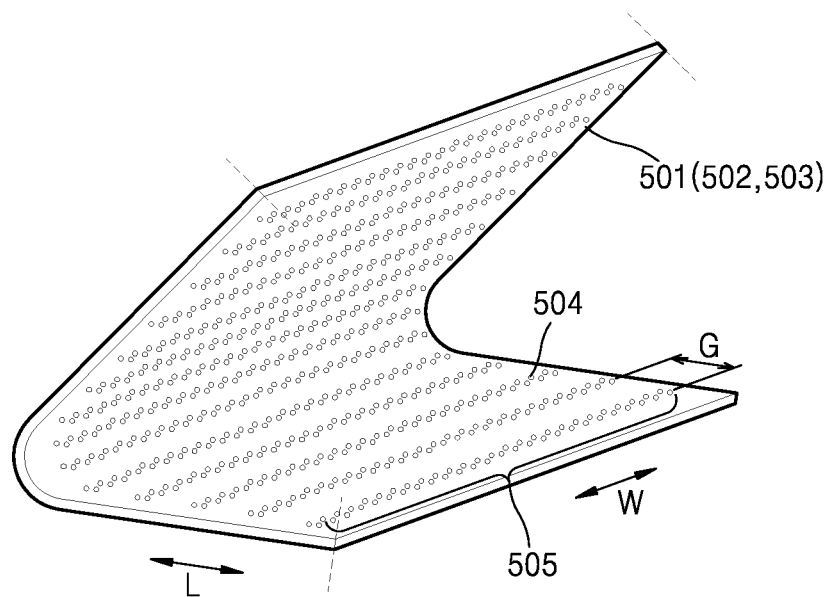
FIG. 18A is a partial perspective view of the flexible display device according to an exemplary embodiment.
Figure 18B:
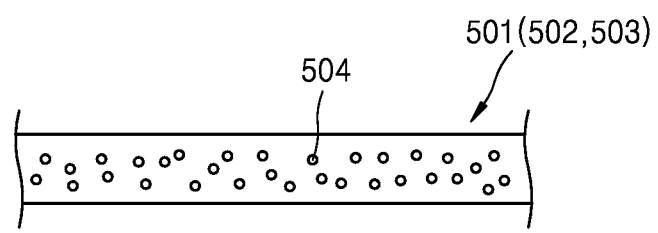
FIG. 18B is a cross-sectional view of an adhesive layer of FIG. 18A.

For example, hard transparent fine particles may be arranged in the adhesive layers 501 502, and 503 in a direction, that is, a width direction W of FIG. 1, that is perpendicular to a folding direction in which the flexible display device 4 folds. FIG. 18A is a partial perspective view of the flexible display device 4 according to an exemplary embodiment. FIG. 18B is a cross-sectional view of the adhesive layer 501, 502, or 503 of FIG. 18A. The adhesive layer 501, 502, or 503 is shown in FIGS. 18A and 18B, but other panels may also be included. The panels may have structures shown in FIGS. 4 and 12 through 17.

Referring to FIGS. 18A and 18B, each of the adhesive layers 501, 502, and 503 includes a plurality of fine particle columns 505 each including transparent fine particles 504 that are hard and are arranged in the width direction W in a light-transmitting adhesive. The plurality of fine particle columns 505 are spaced apart from each other in the longitudinal direction L. A diameter of each of the transparent fine particles 504 is less than a thickness of each of the adhesive layers 501, 502, and 503. The transparent fine particles 504 may be, for example, glass fiber or fiber reinforced plastic (FRP) particles.

Because the adhesive layers 501, 502, and 503, each including the transparent fine particle columns 505, have higher elastic moduli than those in which the transparent fine particle columns 505 are not included, pressed amounts of the adhesive layers 501, 502, and 503 may be less. Accordingly, the probability that the adhesive layers 501, 502, and 503 are pressed and then not restored is reduced and pressed amounts of the adhesive layers 501, 502, and 503 that are pressed are small, thereby reducing image distortion. The adhesive layers 501, 502, and 503 having high elastic moduli may make it difficult for the flexible display device 4 to be pliably bent. This may be overcome by arranging the plurality of fine particle columns 505 in the longitudinal direction L. An interval G between the plurality of transparent fine particle columns 505 in the longitudinal direction L may be, for example, about 2 mm. However, the interval G is not limited to 2 mm, and may be greater or less than 2 mm so that the flexible display device 4 may be pliably bent in consideration of a stiffness of the flexible display device 4. As such, because the transparent fine particles 504 are arranged to extend in the width direction W and to be spaced part from each other in the longitudinal direction L, the flexible display device 4 may be pliably bent in the longitudinal direction L. Also, image distortion which occurs when the adhesive layers 501, 502, and 503 are pressed may be reduced.

To reduce the possibility that the adhesive layers 501, 502, and 503 are pressed and then are not restored and to reduce pressed amounts of the adhesive layers 501, 502, and 503 while maintaining an adhesive force, uneven portions may be formed on at least one of two facing surfaces of two panels that are attached to each other by using the adhesive layers 501, 502, and 503.

Figure 19:
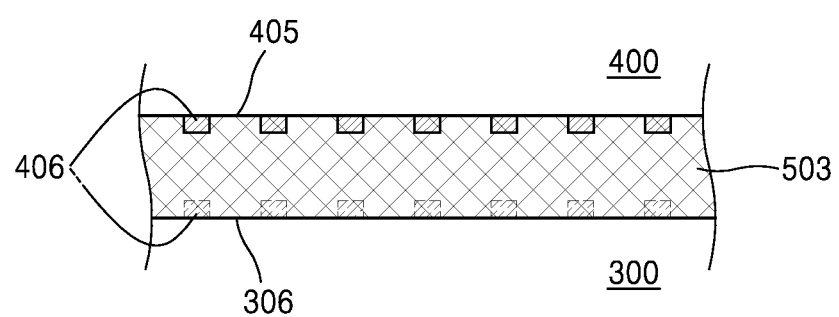
FIG. 19 is a cross-sectional view of the flexible display device according to an exemplary embodiment.

FIG. 19 is a cross-sectional view of the flexible display device 4 that may increase an elastic modulus of each of the adhesive layers 501, 502, and 503 according to an exemplary embodiment. In FIG. 19, the adhesive layer 503 and the protective panel 400 and the touch panel 300 that are attached to each other by using the adhesive layer 503 are shown, but other panels may also be included. Referring to FIG. 19, uneven portions 406 are formed on a surface 405 of the protective panel 400 that is attached to the adhesive layer 503. The uneven portions 406 may be formed as dot patterns by using a light-transmitting resin to protrude from the surface 405. A structure of the protective panel 400 may be the same as that of FIG. 8. The uneven portions 406 may be provided on a surface 306 of the touch panel 300 that is attached to the adhesive layer 503, or may be provided on both the surfaces 405 and 306. An amount of each of the uneven portions 406 that protrudes is less than a thickness of the adhesive layer 503.

In this configuration, because the adhesive layer 503 is compressed by the uneven portions 406 during adhesion, the adhesive layer 503 is more hardened than when there are no uneven portions 406. That is, an elastic modulus of the adhesive layer 503 is increased. Accordingly, a pressed amount of the adhesive layer 503 is reduced and the possibility that the adhesive layers 501, 502, and 503 are pressed and then not restored is reduced, thereby reducing image distortion. Also, because the uneven portions 406 are formed at intervals, the uneven portions 406 do not make it difficult for the flexible display device 4 to be pliably bent.

Figure 20A:
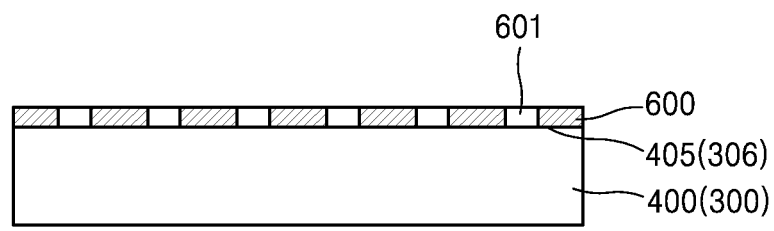
FIGS. 20A through 20C are cross-sectional views illustrating a method of forming uneven portions, according to an exemplary embodiment.
Figure 20B:
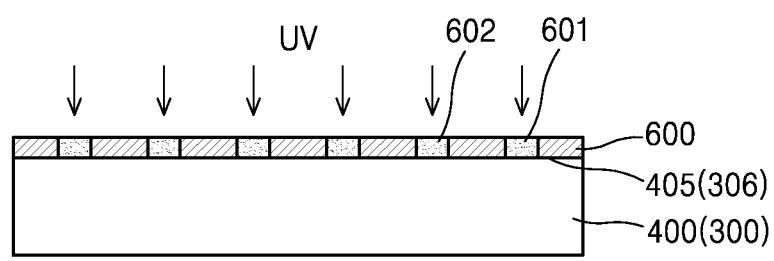
Figure 20C:
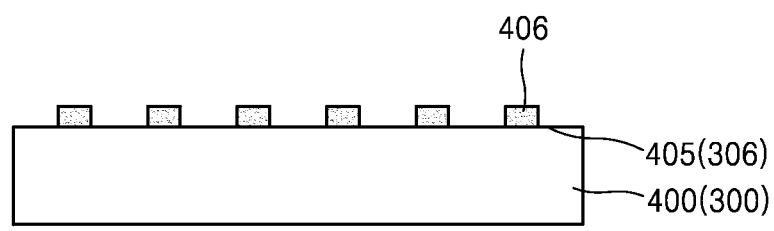

FIGS. 20A through 20C are cross-sectional views illustrating a method of forming the uneven portions 406 according to an exemplary embodiment. First, as shown in FIG. 20A, a mask 600 having openings 601 corresponding to the uneven portions 406 is formed on the surface 405 of the protective panel 400. The mask 600 may be, for example, a film including the openings 601. Next, as shown in FIG. 20B, a transparent ultraviolet-curable resin is injected through the openings 601, ultraviolet rays are emitted, and the transparent ultraviolet-curable resin is cured. Next, the mask 600 is removed. Next, as shown in FIG. 20C, the uneven portions 406 may be formed on the surface 405 of the protective panel 400. A method of forming the uneven portions 406 on the touch panel 300 is the same as that of FIGS. 20A to 20C.

The description made with reference to FIGS. 18 through 20 may apply to FIGS. 4, and 12 through 17.

The foldable device including the flexible display device 4 as shown in FIGS. 1 through 3 repeatedly changes between an unfolding state (see FIG. 2) and a folding state (see FIG. 3). However, the foldable device to which the flexible display device 4 is applied is not limited to that in FIGS. 1 through 3.

Figure 21:
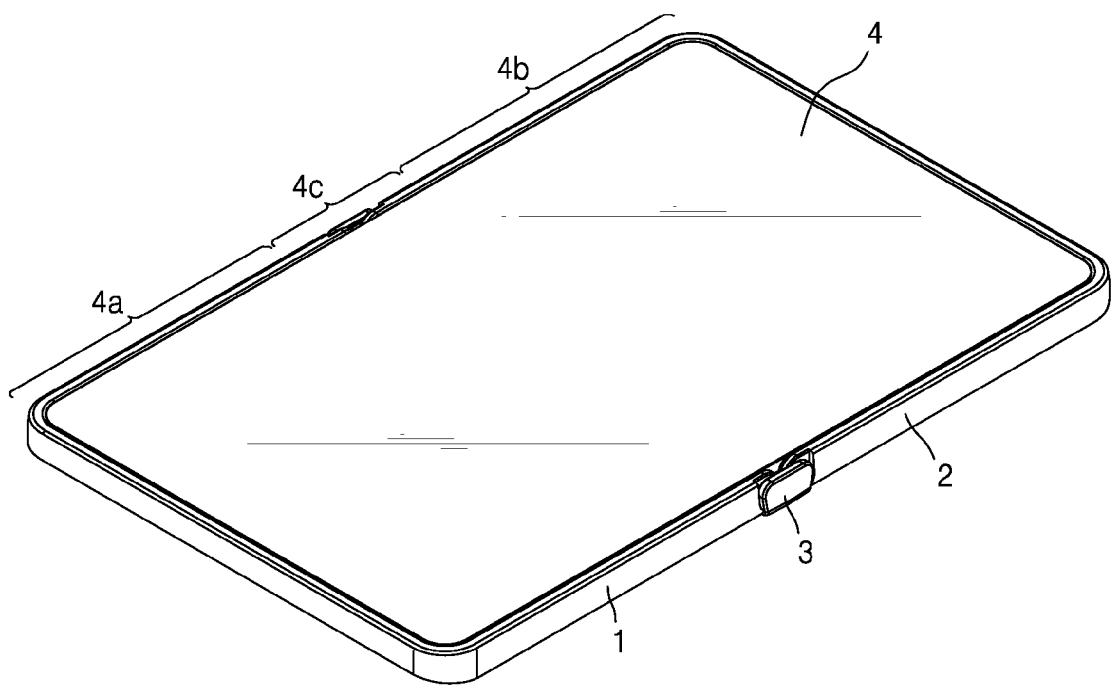
FIG. 21 is a perspective view illustrating an outer appearance of a foldable device according to an exemplary embodiment.
Figure 22:
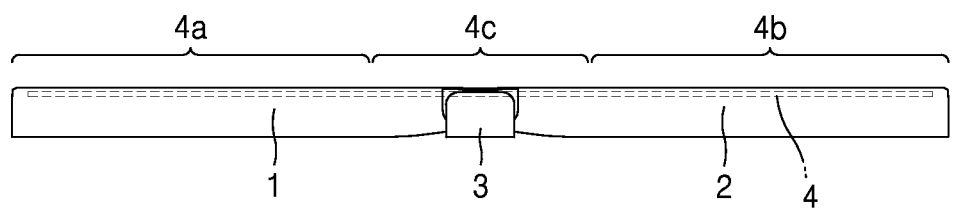
FIG. 22 is a side view illustrating a state in which the foldable device of FIG. 21 is unfolded, according to an exemplary embodiment.
Figure 23:
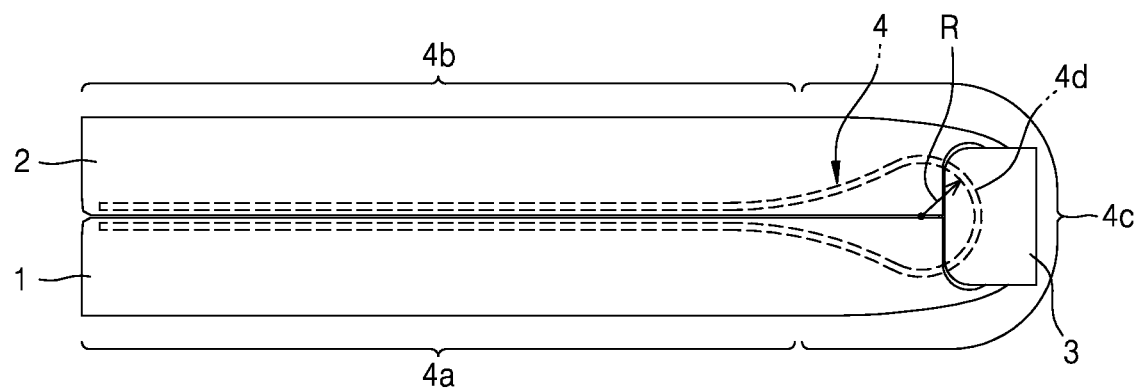
FIG. 23 is a side view illustrating a state in which the foldable device of FIG. 21 is folded, according to an exemplary embodiment.

FIG. 21 is a perspective view illustrating an outer appearance of a foldable device according to an exemplary embodiment. FIG. 22 is a side view illustrating a state in which the foldable device of FIG. 21 is unfolded according to an exemplary embodiment. FIG. 23 is a side view illustrating a state in which the foldable device of FIG. 21 is folded according to an exemplary embodiment. When the foldable device of FIGS. 1 through 3 is folded, the first part 4a and the second part 4b of the flexible display device 4 form an angle therebetween and the third part 4c is bent to have the radius of curvature R. In contrast, when the foldable device of FIGS. 21 through 23 is folded, the first part 4a and the second part 4b are parallel to each other and the third part 4c is bent to have the radius of curvature R and is received in the first and second bodies 1 and 2. Also, the foldable device may have any of various other structures, for example, the flexible device 4 may be disposed outside the first and second bodies 1 and 2.

A plurality of panels constituting the flexible display device 4, for example, the protective panel 400, the touch panel 300, the polarization panel 200, and the display panel 100, may need to withstand a stress applied during repeated bending. A stress applied to each panel is dependent on a distance from the NS. As a distance from the NS increases, a stress applied during a folding/unfolding process increases. Accordingly, it may be necessary to restrict a distance from the NS to each panel.

Figure 24:
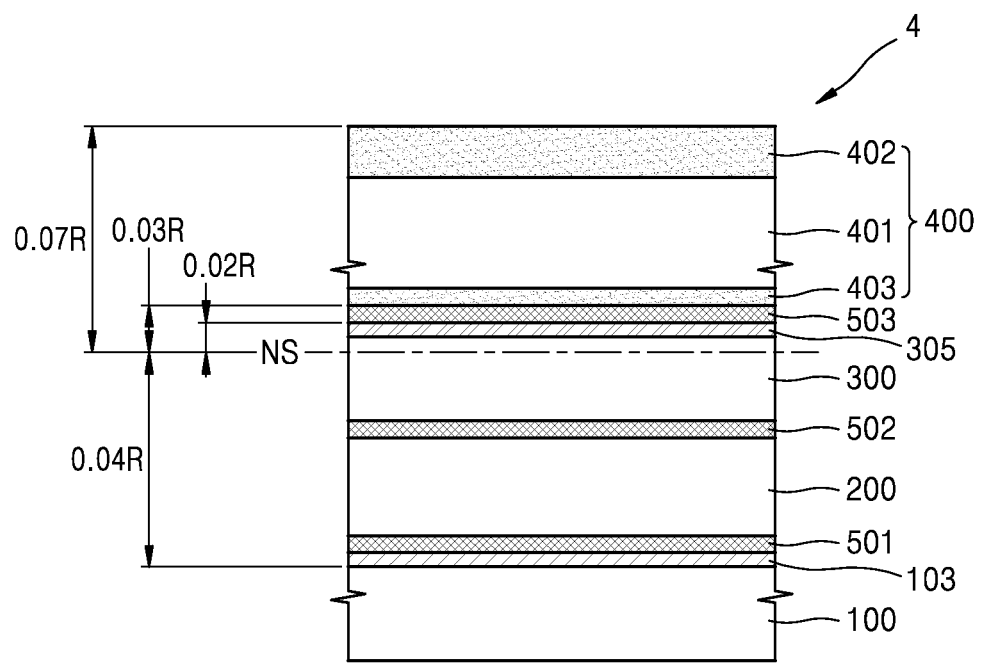
FIG. 24 is a cross-sectional view of the flexible display device according to an exemplary embodiment.

FIG. 24 is a cross-sectional view of the flexible display device 4 according to an exemplary embodiment. The flexible display device 4 is the same as the flexible display device 4 of FIG. 4. Referring to FIG. 24, the display panel 100, the polarization panel 200, the touch panel 300, and the protective panel 400 are sequentially adhered to one another by using the adhesive layers 501, 502, and 503. The display panel 100, the polarization panel 200, the touch panel 300, and the protective panel 400 are the same as those described with reference to FIGS. 5 through 8.

Electrode layers having relatively high hardness among layers of panels of the flexible display device 4, for example, the cathode electrode layer 103 of the display panel 100, the touch electrode layer 305 of the touch panel 300, and the outer and inner hard coating layers 402 and 403 of the protective panel 400, may be damaged due to repeated bending. For example, because the cathode electrode layer 103 and the touch electrode layer 305 are each formed of a metal or a metal oxide thin film such as ITO, copper metal mesh, or silver nanowires and thus are vulnerable to repeated bending, the cathode electrode layer 103 and the touch electrode layer 305 may be disconnected or short-circuited. Also, the outer and inner hard coating layers 402 and 403 having high hardness may break due to repeated bending.

Therefore, a distance from the NS to the cathode electrode layer 103 and the touch electrode layer 305 may be restricted. Also, it may be necessary to restrict a distance from the NS to the outer hard coating layer 402 that is disposed outside the protective panel 400. As the radius of curvature R decreases in a folding state, a stress applied during a folding/unfolding process increases. Accordingly, it may be necessary to restrict a distance from the NS to each panel in consideration of the radius of curvature R.

To this end, a distance between the NS and the cathode electrode layer 103 and a distance between the NS and the touch electrode layer 305 may be equal to or less than about 4% of the radius of curvature R. To prevent the outer hard coating layer 402 from breaking, a distance between the NS and the outer hard coating layer 402 may be equal to or less than about 7% of the radius of curvature R. Exemplary embodiments are not limited to these percentages.

In FIG. 24, the touch panel 300 is disposed between the display panel 100 and the protective panel 400 and the NS is disposed in the touch panel 300. When a distance from the NS to the touch electrode layer 305 is too large, a thickness of the protective panel 400 has to be relatively small. The outer hard coating layer 402 of the protective panel 400 protects the flexible display device 4 from external impacts or scratches and prevents image distortion from occurring when the outer hard coating layer 402 and the inner hard coating layer 403 are pressed. To this end, it may be necessary for the protective panel 400 to have an appropriate thickness. In this regard, a distance between the NS and the touch electrode layer 305 of the touch panel 300 may be equal to or less than about 2% of the radius of curvature R. Also, a distance between the NS and the adhesive layer 503 that adheres the touch panel 300 to the protective panel 400 may be equal to or less than about 3% of the radius of curvature R. Exemplary embodiments are not limited to these percentages.

In this configuration, the flexible display device 4 may be prevented from being damaged due to repeated bending and the reliability of the flexible display device 4 and the foldable device may be improved.

Such restriction of a distance from the NS may apply to any of the flexible display devices 4-1, 4-2, 4-2a, 4-3, 4-4, and 4-5 of FIGS. 12 through 17.

Figure 25:
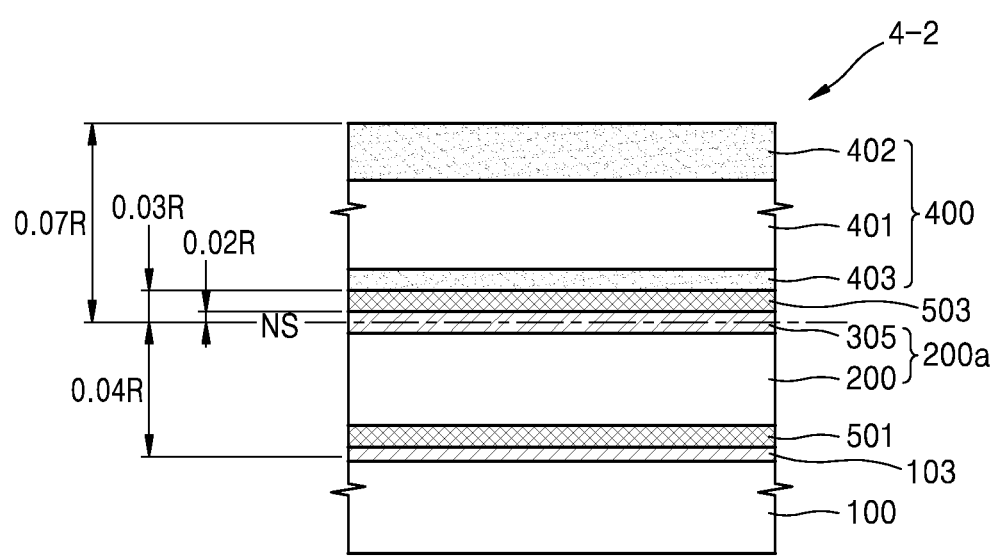
FIG. 25 is a cross-sectional view of the flexible display device in which the touch panel is integrated with the polarization panel, according to an exemplary embodiment.

For example, FIG. 25 is a cross-sectional view of the flexible display device 4-2 in which the touch panel 300 is integrated with the polarization panel 200a. In FIG. 25, a distance between the NS and the cathode electrode layer 103 may be equal to or less than about 4% of the radius of curvature R, and a distance between the NS and the outer hard coating layer 402 may be equal to or less than about 7% of the radius of curvature R to prevent the outer hard coating layer 402 from breaking. To ensure an appropriate thickness of the protective panel 400 and prevent damage to the touch electrode layer 305, a distance from the NS to the touch electrode layer 305 may be equal to or less than about 2% of the radius of curvature R, and a distance from the NS to the adhesive layer 503 may be equal to or less than about 3% of the radius of curvature R. Exemplary embodiments are not limited to these percentages.

Figure 26:
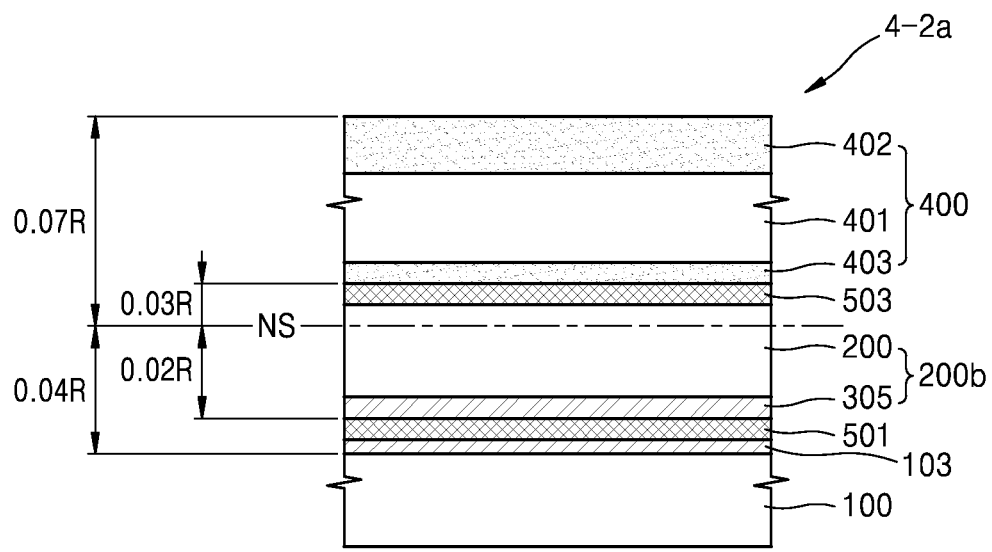
FIG. 26 is a cross-sectional view of the flexible display device in which the touch panel is integrated with the polarization panel, according to an exemplary embodiment.

FIG. 26 is a cross-sectional view of the flexible display device 4-2a in which the touch panel 300 is integrated with the polarization panel 200b. In FIG. 26, a distance between the NS and the cathode electrode layer 103 may be equal to or less than about 4% of the radius of curvature R, and a distance between the NS and the outer hard coating layer 402 may be equal to or less than about 7% of the radius of curvature R to prevent the outer hard coating layer 402 from breaking. A distance from the NS to the adhesive layer 503 may be equal to or less than about 3% of the radius of curvature R to ensure an appropriate thickness of the protective panel 400. A distance from the NS to the touch electrode layer 305 may be equal to or less than about 2% of the radius of curvature R to prevent damage to the touch electrode layer 305. Exemplary embodiments are not limited to these percentages.

Figure 27:
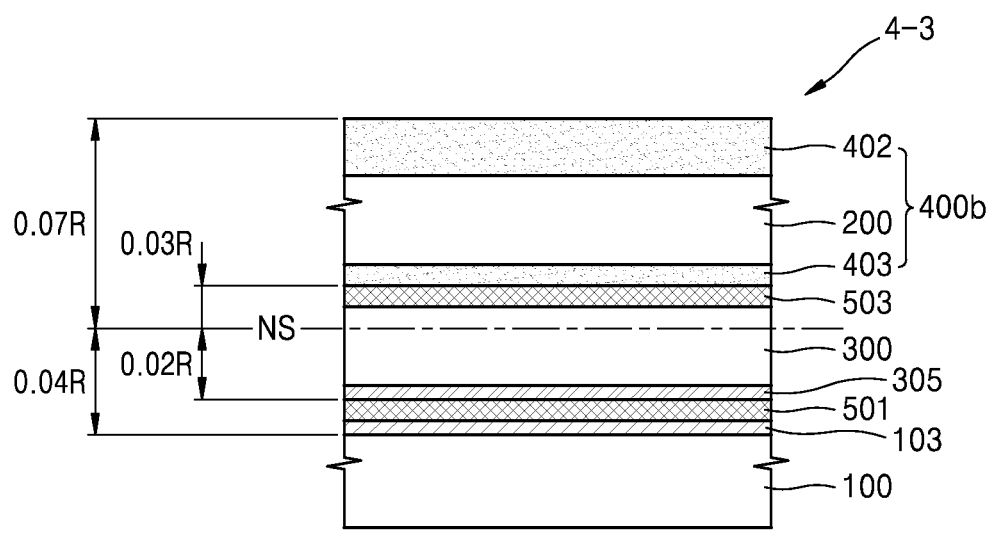
FIG. 27 is a cross-sectional view of the flexible display device in which the polarization panel is integrated with the protective panel, according to an exemplary embodiment.

FIG. 27 is a cross-sectional view of the flexible display device 4-3 in which the polarization panel 200 is integrated with the protective panel 400b. In FIG. 27, a distance between the NS and the cathode electrode layer 103 may be equal to or less than about 4% of the radius of curvature R, and a distance between the NS and the outer hard coating layer 402 may be equal to or less than about 7% of the radius of curvature R to prevent the outer hard coating layer 402 from breaking. A distance from the NS to the touch electrode layer 305 may be equal to or less than about 2% of the radius of curvature R to prevent damage to the touch electrode layer 305, and a distance from the NS to the adhesive layer 503 may be equal to or less than about 3% of the radius of curvature R to ensure an appropriate thickness of the protective panel 400. Exemplary embodiments are not limited to these percentages.

Figure 28:
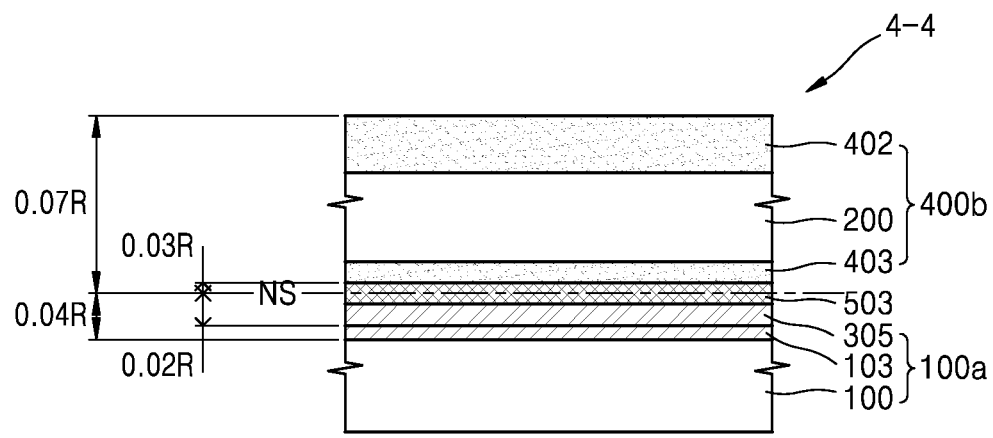
FIG. 28 is a cross-sectional view of the flexible display device in which the polarization panel is integrated with the protective panel and the touch panel is integrated with the display panel, according to an exemplary embodiment.

FIG. 28 is a cross-sectional view of the flexible display device 4-4 in which the polarization panel 200 is integrated with the protective panel 400b and the touch panel 200 is integrated with the display panel 100a. In FIG. 28, a distance between the NS and the cathode electrode layer 103 may be equal to or less than about 4% of the radius of curvature R, and a distance between the NS and the outer hard coating layer 402 may be equal to or less than about 7% of the radius of curvature R to prevent the outer hard coating layer 402 from breaking. A distance from the NS to the adhesive layer 503 may be equal to or less than about 3% of the radius of curvature R to ensure an appropriate thickness of the protective panel 400. A distance from the NS to the touch electrode layer 305 may be equal to or less than about 2% of the radius of curvature R to prevent damage to the touch electrode layer 305. Exemplary embodiments are not limited to these percentages.

Figure 29:
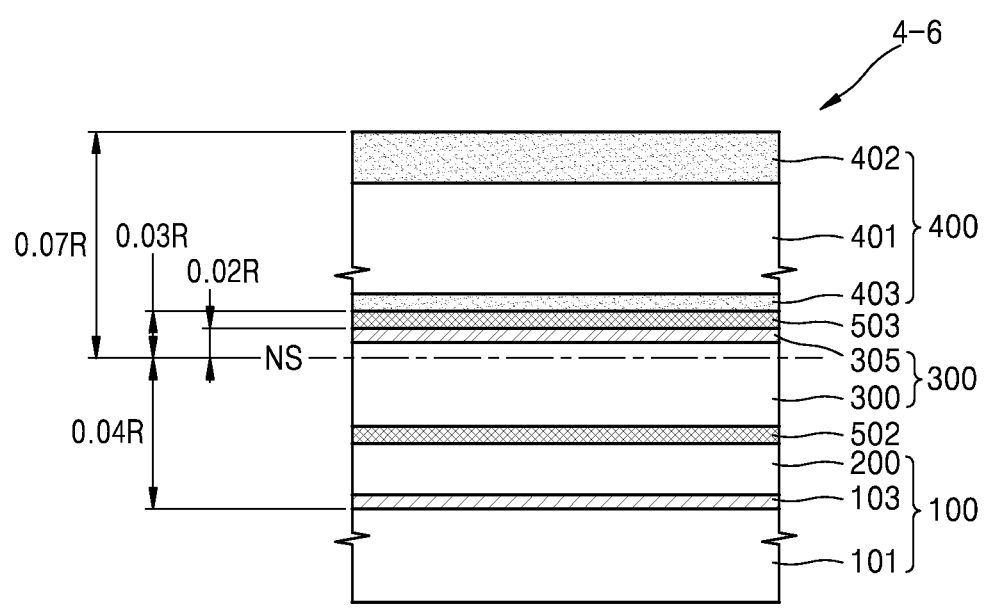
FIG. 29 is a cross-sectional view of a flexible display device in which the polarization panel is integrated with the display panel, according to an exemplary embodiment.

FIG. 29 is a cross-sectional view of a flexible display device 4-6 in which the polarization panel 200 is integrated with the display panel 100. Referring to FIG. 29, the polarization panel 200 may be integrated with the display panel 100 by, for example, omitting the lower support plate 201 (see FIG. 6), and stacking the λ/4 phase plate 204 (see FIG. 6), the linear polarizer 202 (see FIG. 6), and the upper support plate 203 (see FIG. 6) on the encapsulation layer 104 (see FIG. 6). A distance between the NS and the cathode electrode layer 103 may be equal to or less than about 4% of the radius of curvature R, and a distance between the NS and the outer hard coating layer 402 may be equal to or less than about 7% of the radius of curvature R to prevent the outer hard coating layer 402 from breaking. A distance from the NS to the adhesive layer 503 may be equal to or less than about 3% of the radius of curvature R to ensure an appropriate thickness of the protective panel 400. A distance from the NS to the touch electrode layer 305 may be equal to or less than about 2% of the radius of curvature R to prevent damage to the touch electrode layer 305. Exemplary embodiments are not limited to these percentages.

While one or more exemplary embodiments have been described with reference to the figures, it will be understood by those of ordinary skill in the art that various changes in form and details may be made without departing from the spirit and scope as defined by the following claims.

What is claimed is:

1. A flexible display device comprising a plurality of panels that are adhered to each other by using at least one adhesive layer, the flexible display device comprising:
   a display panel configured to display an image; and
   a protective panel disposed on the display panel and comprising a transparent substrate, a first hard coating layer formed on a first surface of the transparent substrate, and a second hard coating layer formed on a second surface of the transparent substrate opposite to the first surface of the transparent substrate, and each of the first hard coating layer and the second hard coating layer has a hardness greater than a hardness of the transparent substrate,
   wherein a thickness of the first hard coating layer is greater than a thickness of the second hard coating layer, and
   wherein a stress neutral surface of the flexible display device is configured so that a compressive stress is applied to the second hard coating layer according to the flexible display device being bent.

2. The flexible display device of claim 1, wherein the stress neutral surface is disposed between the second hard coating layer and the display panel.

3. The flexible display device of claim 1, wherein a touch electrode layer is disposed on the second surface of the transparent substrate, wherein the second hard coating layer is disposed on an inner surface of the touch electrode layer.

4. The flexible display device of claim 1, further comprising a polarization panel disposed between the protective panel and the display panel.

5. The flexible display device of claim 4, wherein a touch electrode layer is disposed on at least one of an inner surface of the polarization panel and an outer surface of the polarization panel.

6. The flexible display device of claim 4, further comprising a touch panel comprising a base substrate configured to transmit light and a touch electrode layer, and wherein the touch panel is disposed between the polarization panel and the protective panel.

7. The flexible display device of claim 1, wherein the transparent substrate comprises a polarization panel.

8. The flexible display device of claim 7, wherein the first hard coating layer and the second hard coating layer are respectively disposed on an outer surface of the polarization panel and an inner surface of the polarization panel.

9. The flexible display device of claim 7, wherein a touch electrode layer is disposed on an outer surface of the display panel.

10. The flexible display device of claim 7, wherein a touch electrode layer is disposed on an inner surface of the polarization panel.

11. The flexible display device of claim 10, wherein the first hard coating layer and the second hard coating layer are respectively disposed on an outer surface of the polarization panel and an inner surface of the touch electrode layer.

12. The flexible display device of claim 1, wherein the at least one adhesive layer comprises a plurality of rows comprising transparent fine particles that are arranged in a width direction, which is perpendicular to a direction in which the flexible display device folds.

13. The flexible display device of claim 12, wherein the transparent fine particles are configured so that the plurality of rows are spaced apart from each other in the direction in which the flexible display device folds.

14. The flexible display device of claim 1, wherein portions that transmit light are formed as a plurality of dot patterns configured to protrude toward the at least one adhesive layer, and are disposed on at least one surface of two facing surfaces of two panels that are attached to each other by using the at least one adhesive layer.

15. The flexible display device of claim 1, wherein the display panel comprises an electrode layer,
   wherein when a radius of curvature of the flexible display device is R, a distance between the stress neutral surface and the electrode layer is configured to be less than or equal to 0.04 times R.

16. The flexible display device of claim 15, wherein a distance between the stress neutral surface and the first hard coating layer is configured to be less than or equal to 0.07 times R.

17. The flexible display device of claim 16, wherein the at least one adhesive layer comprises an adhesive layer configured to adhere the protective panel to another panel,
   wherein a distance between the stress neutral surface and the adhesive layer is configured to be less than or equal to 0.03 times R.

18. The flexible display device of claim 17, further comprising a touch electrode layer configured to receive a touch input,
   wherein a distance between the stress neutral surface and the touch electrode layer is configured to be less than or equal to 0.02 times R.

19. A flexible display device comprising:
a display panel configured to display an image; and
a protective panel disposed on the display panel and comprising a transparent substrate, a first hard coating layer formed on a first surface of the transparent substrate, and a second hard coating layer formed on a second surface of the transparent substrate, and each of the first hard coating layer and the second hard coating layer has a hardness greater than a hardness of the transparent substrate,
wherein the display panel comprises an electrode layer, and
wherein when a radius of curvature of the flexible display device is R, a distance between a stress neutral surface of the flexible display device and the electrode layer is configured to be less than or equal to 0.04 times R.

20. The flexible display device of claim 19, wherein a distance between the stress neutral surface and the first hard coating layer is configured to be less than or equal to 0.07 times R.

21. The flexible display device of claim 20, further comprising an adhesive layer configured to adhere the protective panel to another panel,
wherein a distance between the stress neutral surface and the adhesive layer is configured to be less than or equal to 0.03 times R.

22. The flexible display device of claim 21, further comprising a touch electrode layer configured to receive a touch input,
wherein a distance between the stress neutral surface and the touch electrode layer is configured to be less than or equal to 0.02 times R.

23. The flexible display device of claim 19, wherein the stress neutral surface is configured so that a compressive stress is applied to the second hard coating layer according to the flexible display device being bent.

24. A flexible display device comprising:
a plurality of panels comprising a display panel configured to display an image and a protective panel disposed on the display panel; and
at least one adhesive layer configured to adhere the plurality of panels to each other,
wherein the at least one adhesive layer comprises a plurality of rows comprising transparent fine particles that are arranged in a width direction, which is perpendicular to a direction in which the flexible display device folds.

25. The flexible display device of claim 24, wherein the transparent fine particles are arranged so that the plurality of rows are spaced apart from each other in the direction in which the flexible display device folds.

26. A flexible display device comprising:
a plurality of panels comprising a display panel configured to display an image and a protective panel disposed on the display panel; and
at least one adhesive layer configured to adhere the plurality of panels to each other,
wherein each surface of two facing surfaces of two panels that are attached to each other by using the at least one adhesive layer comprises a plurality of dot patterns that protrude toward the at least one adhesive layer.

* * * * *